US010009201B2

(12) United States Patent
Kim et al.

(10) Patent No.: US 10,009,201 B2
(45) Date of Patent: Jun. 26, 2018

(54) RECEIVER AND WIRELESS TERMINAL FOR SIGNAL PROCESSING

(71) Applicant: Samsung Electronics Co., Ltd., Gyeonggi-do (KR)

(72) Inventors: Young-min Kim, Gyeonggi-do (KR); Pil-sung Jang, Gyeonggi-do (KR); Thomas Byunghak Cho, Gyeonggi-do (KR); Seung-chan Heo, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 217 days.

(21) Appl. No.: 14/994,717

(22) Filed: Jan. 13, 2016

(65) Prior Publication Data
US 2016/0204966 A1 Jul. 14, 2016

Related U.S. Application Data

(60) Provisional application No. 62/102,834, filed on Jan. 13, 2015.

(30) Foreign Application Priority Data

Aug. 17, 2015 (KR) ........................ 10-2015-0115411

(51) Int. Cl.
*H04B 1/16* (2006.01)
*H04W 88/02* (2009.01)
(Continued)

(52) U.S. Cl.
CPC .......... *H04L 27/14* (2013.01); *H03F 1/0205* (2013.01); *H03F 1/0277* (2013.01); *H03F 3/19* (2013.01); *H03F 3/193* (2013.01); *H03F 3/72* (2013.01); *H04B 1/16* (2013.01); *H03F 2200/111* (2013.01); *H03F 2200/165* (2013.01);
(Continued)

(58) Field of Classification Search
CPC ......... H04L 27/14; H03F 3/72; H03F 1/0277; H03F 3/193; H03F 1/0205; H03F 3/19; H03F 2203/7209; H03F 2200/111; H03F 2200/451; H03F 2200/165; H04W 84/042; H04W 88/02; H04B 1/16
See application file for complete search history.

(56) References Cited

U.S. PATENT DOCUMENTS 8,548,410 B2  10/2013  Jussila et al.
8,903,409 B2  12/2014  Winiecki et al.
(Continued)

FOREIGN PATENT DOCUMENTS

EP        2615764        7/2013
WO    WO 2014088218    6/2014

*Primary Examiner* — Andrew Wendell
(74) *Attorney, Agent, or Firm* — The Farrell Law Firm, P.C.

(57) ABSTRACT

A wireless terminal and a receiver are provided that include a first amplifier configured to receive and amplify a first radio frequency (RF) input signal, and configured to output a first RF output signal corresponding to a first carrier included in a first frequency band. The receiver also includes a first sub amplifier configured to, when a mode signal indicates a first mode, receive a first internal signal from the first amplifier, amplify the first internal signal, and output a second RF output signal corresponding to a second carrier included in the first frequency band.

20 Claims, 31 Drawing Sheets

(51) Int. Cl.
  *H03F 3/19*   (2006.01)
  *H04L 27/14*  (2006.01)
  *H03F 1/02*   (2006.01)
  *H03F 3/193*  (2006.01)
  *H03F 3/72*   (2006.01)
  *H04W 84/04*  (2009.01)

(52) U.S. Cl.
  CPC .............. *H03F 2200/451* (2013.01); *H03F 2203/7209* (2013.01); *H04W 84/042* (2013.01); *H04W 88/02* (2013.01)

(56) References Cited

U.S. PATENT DOCUMENTS

| | | |
|---|---|---|
| 2012/0087257 A1 | 4/2012 | Larsson et al. |
| 2013/0114578 A1 | 5/2013 | Lim et al. |
| 2013/0231064 A1 | 9/2013 | Gudem et al. |
| 2013/0315348 A1 | 11/2013 | Tasic et al. |
| 2013/0316668 A1 | 11/2013 | Davierwall et al. |
| 2013/0316669 A1 | 11/2013 | Davierwalla |
| 2013/0316670 A1 | 11/2013 | Tasic et al. |
| 2014/0072001 A1 | 3/2014 | Chang et al. |
| 2014/0113573 A1 | 4/2014 | Khatri et al. |
| 2014/0113578 A1 | 4/2014 | Xu et al. |
| 2014/0126401 A1 | 5/2014 | Motamed et al. |
| 2014/0170999 A1 | 6/2014 | Aparin |
| 2014/0240048 A1* | 8/2014 | Youssef .................. H03F 1/223 330/296 |
| 2015/0087245 A1* | 3/2015 | Hadji-Abdolhamid ............................ H04B 1/0057 455/77 |
| 2015/0318975 A1 | 11/2015 | Lim et al. |
| 2015/0333949 A1* | 11/2015 | Tasic .................... H04L 27/2653 370/329 |
| 2016/0248390 A1* | 8/2016 | Issakov .................. H03F 3/265 |
| 2017/0093343 A1* | 3/2017 | Xu ............................ H03F 1/26 |

* cited by examiner

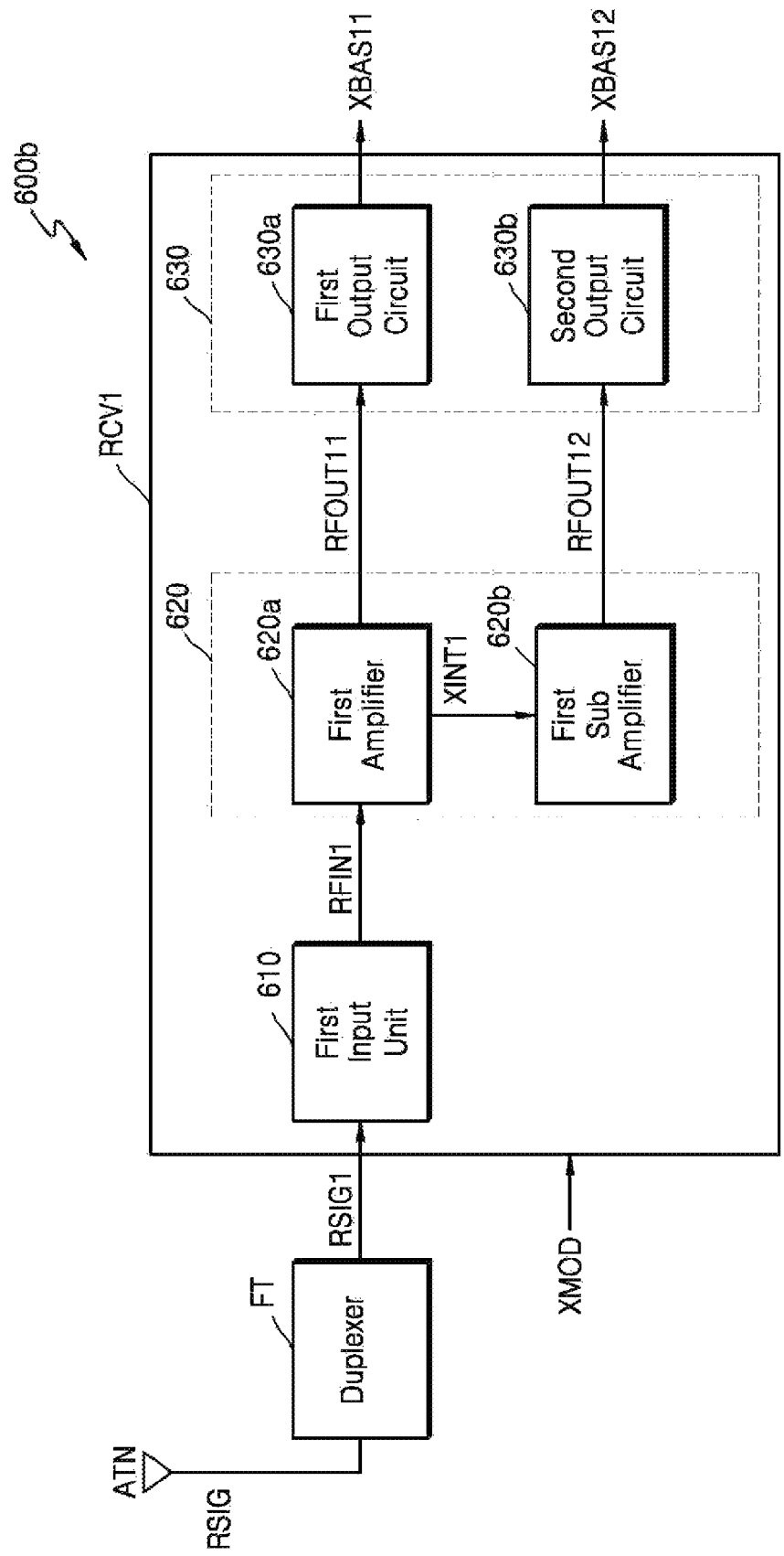

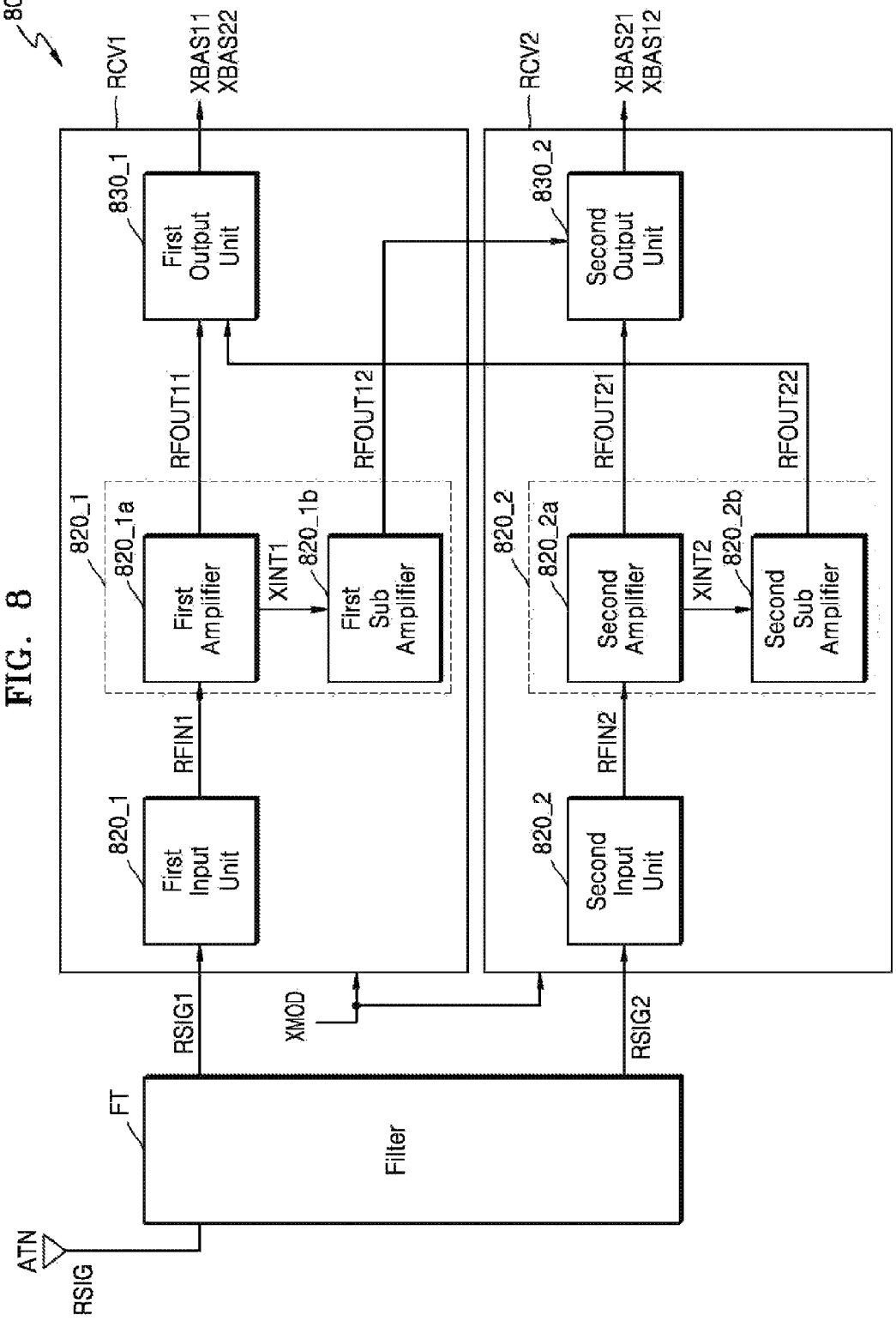

RECEIVER AND WIRELESS TERMINAL FOR SIGNAL PROCESSING

PRIORITY

This application claims priority under 35 U.S.C. § 119(e) to U.S. Provisional Application No. 62/102,834, filed on Jan. 13, 2015, in the U.S. Patent and Trademark Office, and claims priority under 35 U.S.C. § 119(a) to Korean Patent Application No. 10-2015-0115411, filed on Aug. 17, 2015, in the Korean Intellectual Property Office, the contents of which are incorporated herein by reference.

BACKGROUND

1. Field of the Inventive Concept

The inventive concept relates generally to signal processing, and more particularly to a receiver, a wireless terminal, and an operation method of the wireless terminal, which efficiently process a signal when the signal is received over a mobile network.

2. Description of the Related Art

A transceiver of a wireless terminal adds data into a radio frequency (RF) carrier signal to modulate the RF carrier signal into an RF signal. The transceiver amplifies the RF signal to transmit the amplified RF signal to a mobile network. The transceiver receives an RF signal from the mobile network, amplifies the received RF signal, and modulates the amplified RF signal. In order to transmit or receive a large amount of data, the wireless terminal supports a carrier aggregation function, namely, transmission or reception of an RF carrier signal obtained through modulation based on multi carriers. When the carrier aggregation function is applied, degradation of a noise feature or a gain feature should be prevented, and a gain of an independent receiver between RF carrier signals should be adjusted.

SUMMARY

The inventive concept provides a receiver, a wireless terminal, and an operation method of the wireless terminal, which efficiently process a received signal.

According to an aspect of the inventive concept, a receiver includes a first amplifier configured to receive and amplify a first RF input signal, and configured to output a first RF output signal corresponding to a first carrier included in a first frequency band. The receiver also includes a first sub amplifier configured to, when a mode signal indicates a first mode, receive a first internal signal from the first amplifier, amplify the first internal signal, and output a second RF output signal corresponding to a second carrier included in the first frequency band.

According to another aspect of the inventive concept, a wireless terminal is provided that includes a first receiver. The first receiver includes a first input unit configured to perform impedance matching on a first reception signal to output a first RF input signal. The first reception signal is obtained by filtering a received signal based on a first frequency band. The first receiver also includes a first amplification unit configured to amplify the first RF input signal received from the first input unit and output one or more first RF output signals in an inter-band carrier aggregation (CA) mode and an intra-band CA mode. The first receiver also includes a first output unit configured to down-convert at least one of the one or more first RF output signals to a baseband.

According to another aspect of the inventive concept, a wireless terminal is provided that includes an antenna configured to receive a reception signal transmitted over a long-term evolution advanced (LTE-A) communication network. The wireless terminal also includes a filter configured to filter the reception signal based on a plurality of frequency bands. The wireless terminal further includes a plurality of receivers configured to process a filtered signal to generate a baseband signal. At least one of the plurality of receivers includes a first amplifier having a first transistor connected between a first node and a second node. The first transistor includes a first gate that receives an RF input signal obtained by performing impedance matching on the filtered signal. The first amplifier also has a second transistor configured to output a first RF output signal corresponding to a first carrier. The second transistor is larger in size than the first transistor. The second transistor includes a first source connected to the first node and a first drain of the first transistor. The second transistor also includes a second drain connected to a first output node. The at least one of the plurality of receivers also includes a first sub amplifier having a third transistor connected between a third node and a fourth node. The third transistor is activated in an intra-band CA mode. The third transistor includes a second gate that receives a first internal signal from the first node. The first sub amplifier also includes a fourth transistor configured to output a second RF output signal corresponding to a second carrier of a frequency band of the first carrier. The fourth transistor includes a second source connected to the third node and a third drain of the third transistor. The fourth transistor includes a fourth drain connected to a second output node.

BRIEF DESCRIPTION OF THE DRAWINGS

The above and other aspects, features, and advantages of the inventive concept will be more apparent from the following detailed description when taken in conjunction with the accompanying drawings, in which:

FIGS. 6A and 6B are diagrams illustrating a wireless terminal, according to an embodiment of the inventive concept;

FIG. 8 is a diagram illustrating a wireless terminal, according to an embodiment of the inventive concept;

DETAILED DESCRIPTION OF EMBODIMENTS

Figure 1:
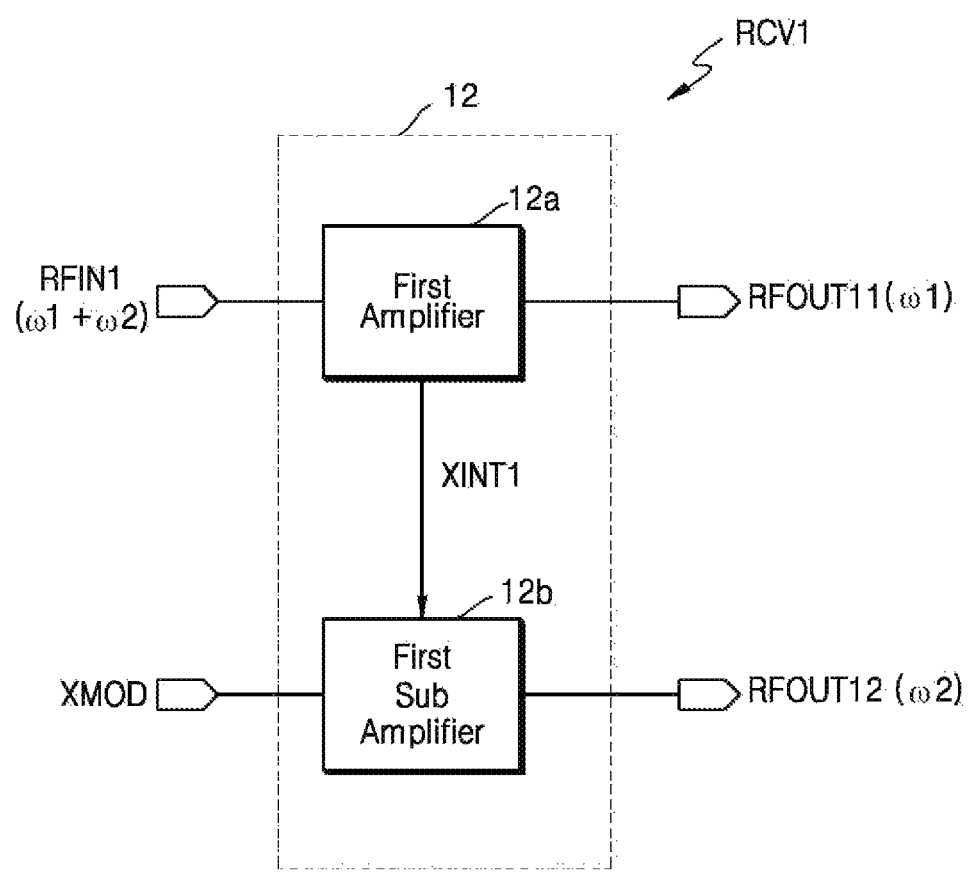
FIG. 1 is a diagram illustrating a first receiver, according to an embodiment of the inventive concept.

Embodiments are described in detail with reference to the accompanying drawings. The same or similar components may be designated by the same or similar reference numerals although they are illustrated in different drawings. Detailed descriptions of constructions or processes known in the art may be omitted to avoid obscuring the subject matter of the inventive concept.

As used herein, the term "and/or" includes any and all combinations of one or more of the associated listed items. Expressions such as "at least one of", when preceding a list of elements, modify the entire list of elements and do not modify the individual elements of the list.

Embodiments of the inventive concept are provided so that this disclosure is thorough and complete, and fully conveys the concept of the inventive concept to one of ordinary skill in the art. The inventive concept is not limited within specific embodiments and it should be understood that the inventive concept covers all the modifications, equivalents, and replacements within the idea and technical scope of the inventive concept.

In the drawings, the dimensions and size of each structure may be exaggerated, reduced, or schematically illustrated for convenience in description and clarity.

The terms used herein are not intended to limit the embodiments of the inventive concept. Technical terms are used only to explain a specific embodiment while not limiting the embodiments of the inventive concept. The terms used in a singular form may also include plural forms, unless referred to the contrary. The meanings of "include," "comprise," "including," or "comprising," specify a property, a region, a fixed number, a step, a process, an element, and/or a component but does not exclude other properties, regions, fixed numbers, steps, processes, elements, and/or components. Terms such as "first" and "second" may be used to describe various elements, but the elements should not be limited by the terms. The terms may be used only to distinguish one element from another element. Herein, when a first feature is described as being connected or coupled to a second feature, this does not exclude that a third feature from being disposed between the first feature and the second feature.

Unless otherwise defined, all terms (including technical and scientific terms) used herein have the same meanings as those commonly understood by one of ordinary skill in the art to which this invention belongs. It will be further understood that terms, such as those defined in commonly used dictionaries, should be interpreted as having meanings that are consistent with their meanings in the context of the relevant art and will not be interpreted in an idealized or overly formal sense unless expressly so defined herein.

Hereinafter, embodiments will be described with reference to the accompanying drawings.

FIG. 1 is a diagram illustrating a first receiver, according to an embodiment of the inventive concept. Referring to FIG. 1, a first receiver RCV1 includes a first amplification unit 12. The first amplification unit 12 includes a first amplifier 12a and a first sub amplifier 12b. In a first mode, the first amplifier 12a may receive and amplify a first RF input signal RFIN1, obtained through modulation based on two or more carriers of the same frequency band, to output a first RF output signal RFOUT11. The first sub amplifier 12b may amplify a first internal signal XINT1 applied from the first amplifier 12a to output a first RF output signal RFOUT12. In FIG. 1, the first RF input signal RFIN1 is obtained through modulation based on two carriers (for example, a first carrier $\omega 1$ and a second carrier $\omega 2$). However, the inventive concept is not limited thereto. In other embodiments, as illustrated in FIG. 2, the first receiver RCV1 may process the first RF input signal RFIN1 obtained through modulation based on two carriers.

Figure 2:
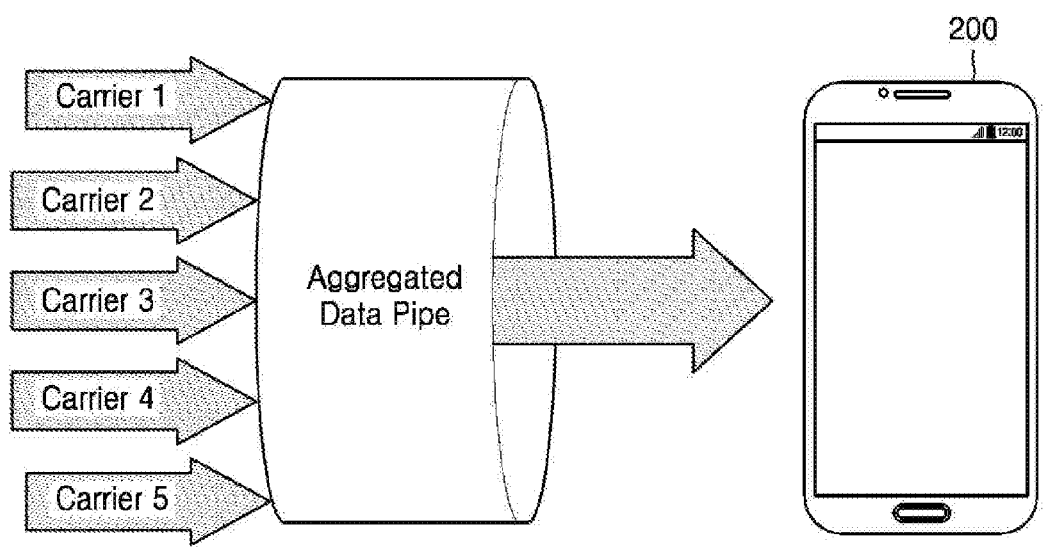
FIGS. 2 to 4 are diagrams illustrating carrier aggregation technology, according to an embodiment of the inventive concept.
Figure 3:
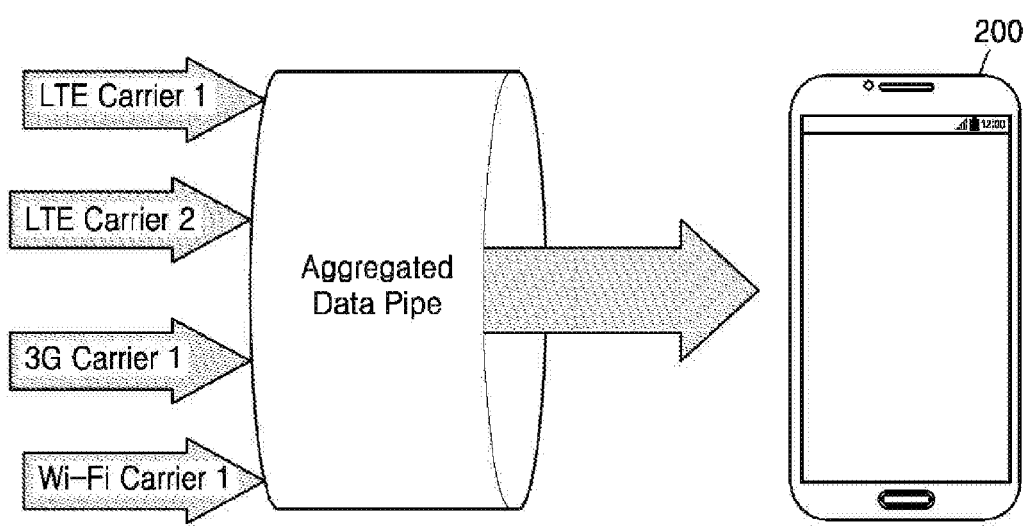
Figure 4:
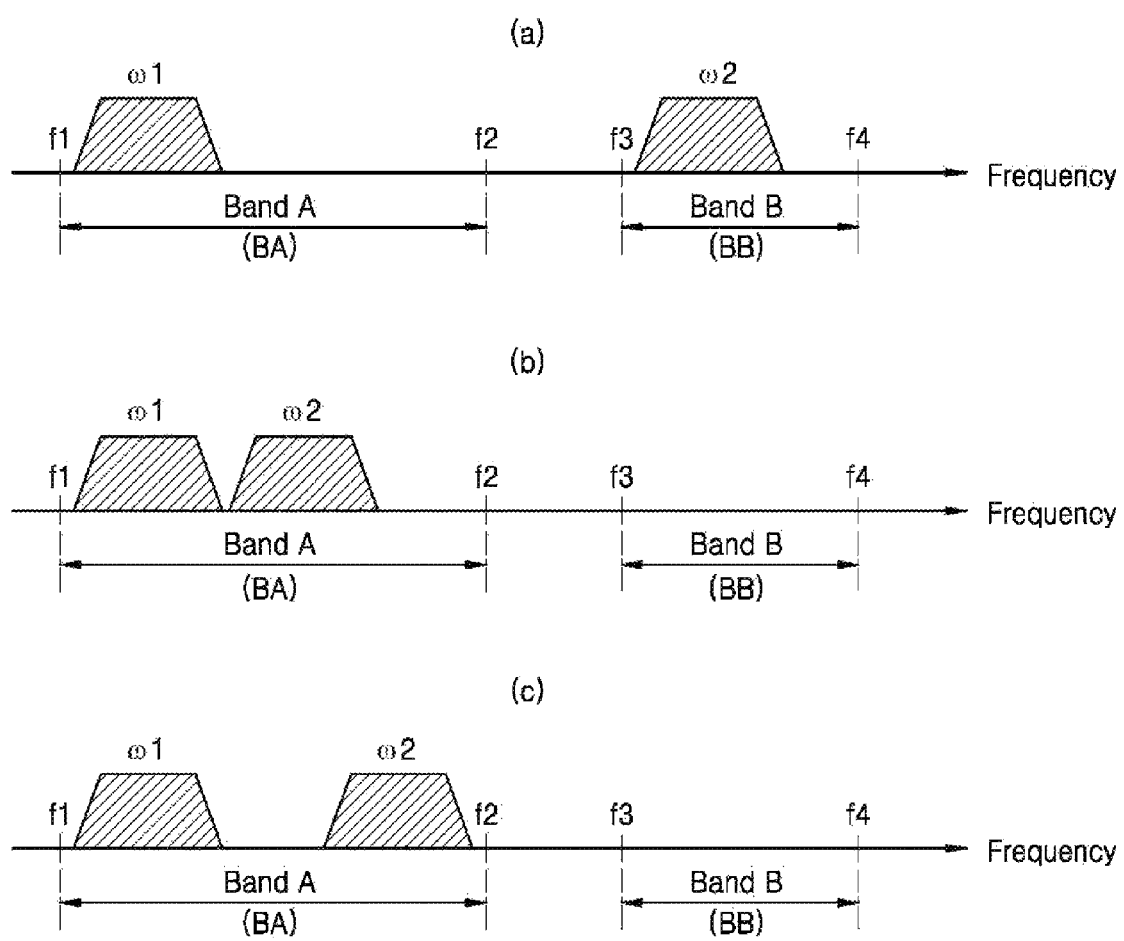

FIGS. 2 to 4 are diagrams illustrating CA technology, according to an embodiment of the inventive concept. The CA technology where one base station combines and operates a plurality of frequency bands has been proposed to satisfy requirements for an increased bit rate. Long term evolution (LTE), which is a type of mobile network, may implement a data transmission speed of 100 Mbps, and thus, massive video may also be smoothly transmitted or received in a mobile environment. According to LTE standard, multi-carrier technology may be supported that selects one frequency from among a plurality of frequencies in consideration of district-based data traffic congestion and provides optimal communication quality to a user. According to the multi-carrier technology, a frequency used by a number of users may be distributed to another frequency, and thus, data concentration on one frequency is solved. For example, according to the multi-carrier technology, if a number of users use a frequency of 800 MHz, data may be automatically distributed to a frequency of 1.8 GHz.

However, by merely using the multi-carrier technology based on the LTE standard, a degressive transmission speed may increase, but an actual transmission speed may not increase. Therefore, LTE-advanced (LTE-A) technology for implementing a faster data transmission speed has been developed. The CA technology may be frequency extension technology where one base station combines and operates a plurality of frequency bands. FIG. 2 illustrates an example where five frequency bands, based on the LTE standard, are combined by the CA technology, and thus, a data transmission speed increases by five times. Carriers 1 to 5, illustrated in FIG. 2, may be carriers defined in the LTE, and in the LTE standard, one frequency band may be defined as a maximum of 20 MHz. Accordingly, a wireless terminal 200, according to an embodiment of the inventive concept, enhances a data rate to a bandwidth of a maximum of 100 MHz. A carrier defined in the LTE may be referred to as a component carrier.

FIG. 2 illustrates an example of combining only carriers defined in the LTE, but the inventive concept is not limited thereto. As illustrated in FIG. 3, carriers of different mobile networks may be combined. Referring to FIG. 3, in an operation where frequency bands are combined by the CA technology, frequency bands based on 3rd generation (3G) standard and Wi-Fi standard, in addition to the LTE standard, may be combined together. As described above, since the LTE-A uses the CA technology, faster data transmission is performed. As illustrated in FIGS. 2 and 3, the wireless terminal 200, according to an embodiment of the inventive concept, may receive an input where a number of carriers are combined. Hereinafter, however, for convenience of description, if not separately described, an operation is performed based on an input where two carriers are combined.

Referring to FIGS. 1 and 4, a first carrier ω1 and a second carrier ω2 of a signal received over a mobile network may have different frequency bands or the same frequency band. For example, the first carrier ω1 may be set to a frequency of a first frequency band BA, and the second carrier ω2 may be set a frequency of a second frequency band BB (see (a) of FIG. 4). The first frequency band BA is a frequency band from a first frequency f1 to a second frequency f2, and the second frequency band BB is a frequency band from a third frequency f3 to a fourth frequency f4. For example, the first carrier ω1 may be a carrier of 800 MHz, and the second carrier ω2 may be a carrier of 1.8 GHz.

Alternatively, the first carrier ω1 and the second carrier ω2 may all be set to a frequency of the first frequency band BA (see (b) and (c) of FIG. 4). In this case, the first carrier ω1 and the second carrier ω2 are contiguous in the same frequency band (see (b)), or are non-contiguous in the same frequency band (see (c)).

FIG. 4 illustrates an example where the first frequency band BA and the second frequency band BB are set to different frequency bands. For example, the first frequency band BA may be set to a bandwidth of 20 MHz, and the second frequency band BB may be set to a bandwidth of 10 MHz. However, the inventive concept is not limited thereto. Bandwidths of the first frequency band BA and the second frequency band BB may be set to the same bandwidth. For example, the first frequency band BA and the second frequency band BB may be set to a bandwidth of 20 MHz.

The first receiver RCV1 may operate in different modes according to whether the first carrier ω1 and the second carrier ω2 are within the same frequency band or different frequency bands. As illustrated in (a) of FIG. 4, when the first carrier ω1 and the second carrier ω2 are within different frequency bands, the first receiver RCV1 may operate in an inter-band CA mode. As illustrated in (b) and (c) of FIG. 4, when the first carrier ω1 and the second carrier ω2 are within the same frequency band, the first receiver RCV1 may operate in an intra-band CA mode. The above-described first mode may represent an intra-band mode. In another embodiment, the first receiver RCV1 may operate in a non-CA mode to which the CA technology is not applied.

The first receiver RCV1, according to an embodiment of the inventive concept, may support all of the non-CA mode, the inter-band CA mode, and the intra-band CA mode. Also, the first receiver RCV1, according to an embodiment of the inventive concept, may output the first RF output signal RFOUT11 based on the first carrier ω1 through the first amplifier 12a in the non-CA mode and the inter-band CA mode, and in the intra-band CA mode, the first receiver RCV1 may output the first RF output signal RFOUT11 based on the first carrier ω1 through the first amplifier 12a and may amplify a voltage (a first internal signal XINT1) of an arbitrary node of the first amplifier 12a to output the first RF output signal RFOUT12 based on the second carrier ω2. Therefore, an input impedance of the first receiver RCV1 may be the same in the non-CA mode, the inter-band CA mode, and the intra-band CA mode. Since the input impedance is the same in the modes, input impedance matching may not be newly performed whenever a mode is switched, and thus, loss caused by mode switching is reduced.

As described above, the first receiver RCV1 operates more stably, more accurately processes the first RF input signal RFIN1, or reduces power consumption. For reference, a first frequency band, as described below, may be referred to as the first frequency band BA (see FIG. 4), and a second frequency band to be described below may be referred to as the second frequency band BB (see FIG. 4).

Figure 5A:
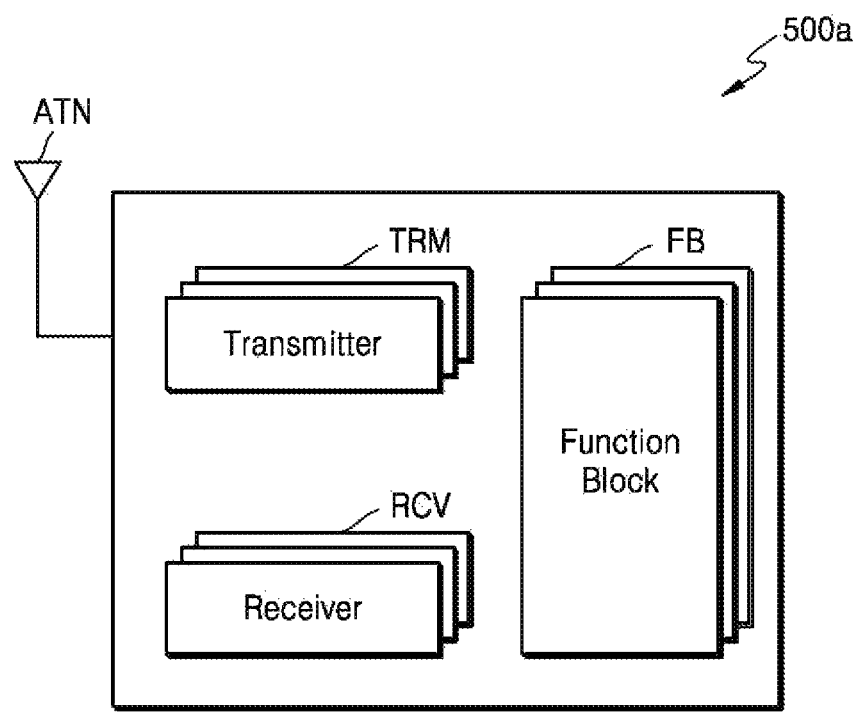
FIGS. 5A and 5B are diagrams illustrating a wireless terminal, according to an embodiment of the inventive concept.
Figure 5B:
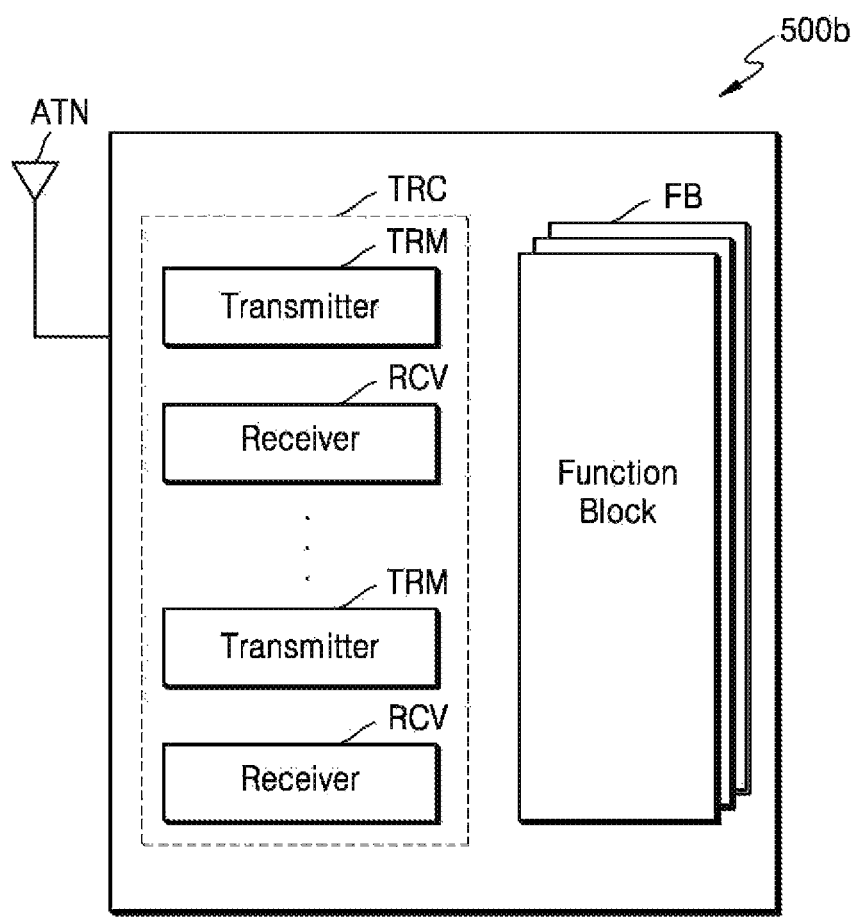

FIGS. 5A and 5B are diagrams illustrating a wireless terminal, according to an embodiment of the inventive concept. Referring to FIG. 5A, a wireless terminal 500a includes an antenna ATN, a plurality of function blocks FBs, a transmitter TRM, and a receiver RCV. Each of the plurality of function blocks FBs may perform a certain operation. For example, one of the plurality of function blocks FBs may be a central processing unit (CPU) that controls an operation of the wireless terminal 500a, a digital signal processor (DSP) that fast-converts an analog signal into a digital signal, or the like.

The transmitter TRM may amplify, filter, and up-convert information or data obtained through processing by the plurality of FBs, and may convert the information or the data into an analog signal transmittable to the mobile network. The transmitter TRM may be provided in plurality, and the plurality of transmitters TRMs may separately perform the certain operation for the frequency bands. For example, one of the plurality of transmitters TRMs may process a signal of the first frequency band BA of FIG. 4, and another of the plurality of transmitters TRMs may process a signal of the second frequency band BB.

A signal obtained through processing by the transmitter TRM may be output from the wireless terminal 500a to a base station through the antenna ATN. The antenna ATN may receive a signal from the base station. In FIG. 5A, the wireless terminal 500a is illustrated as including one antenna ATN, but the inventive concept is not limited thereto. In other embodiments, a plurality of antennas ATNs may be provided. Also, the antenna ATN may only perform transmission of a signal, or may only perform reception of a signal. In FIG. 5A, for convenience of description, the antenna ATN is illustrated as being disposed outside the wireless terminal 500a, but the antenna ATN may be integrated into the wireless terminal 500a.

A signal received from the antenna ATN may be supplied to a corresponding receiver RCV among the plurality of receivers RCV according to a frequency band. For example, one of the receivers RCV may process a signal of the first frequency band BA of FIG. 4, and the other one receiver RCV may process a signal of the second frequency band BB. The receiver RCV may perform impedance matching, filtering, amplifying, and down-converting to a baseband on a signal received through the antenna ATN.

In FIG. 5A, the transmitter TRM and receiver RCV of the wireless terminal 500a are illustrated as being separated from each other, but embodiments of the inventive concept are not limited thereto. As illustrated in FIG. 5B, a wireless terminal 500b may include transceiver TRC where a transmitter TRM and a receiver RCV are combined, instead of including a transmitter TRM and a receiver RCV which are separated from each other. In this case, the transceiver TRC or some elements of the transceiver TRC may be implemented as one module. For example, an amplification unit (e.g., 620 of FIG. 6A), an output unit (e.g., 630 of FIG. 6A), and a transmission circuit (a circuit which performs amplifying, filtering, and frequency up-converting on a signal to be transmitted) which may be included in the transceiver TRC may be implemented as one chip like a radio integrated circuit (RFIC). Furthermore, although not shown, the wireless terminal 500a (500b), according to an embodiment of the inventive concept, may further include a separate transmitter TRM or receiver RCV along with the transceiver TRC. At least one of the plurality of receivers RCV illustrated in FIGS. 5A and 5B may be implemented as the first receiver RCV of FIG. 1.

Figure 6A:
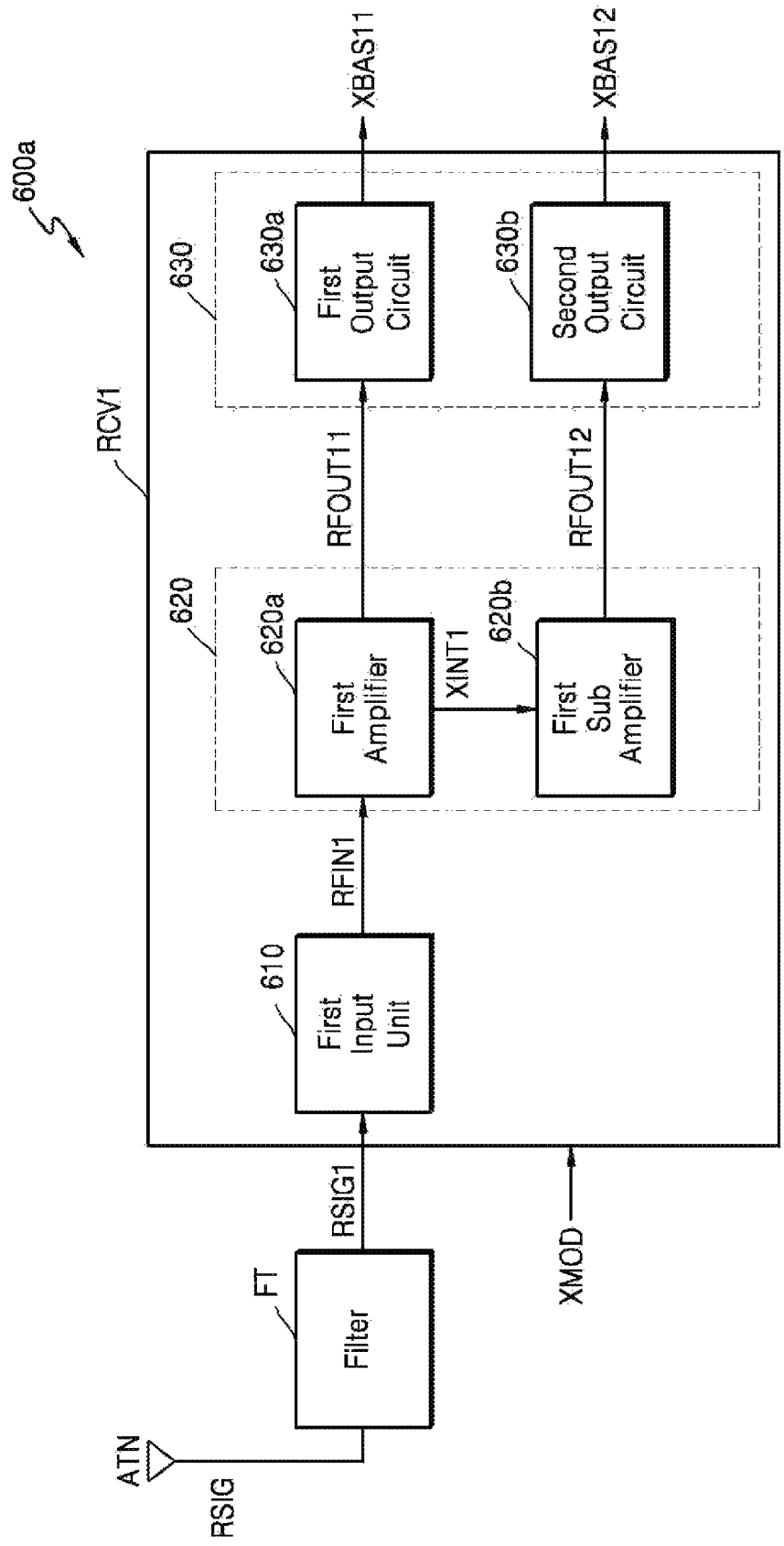

FIGS. 6A and 6B are diagrams illustrating a wireless terminal, according to an embodiment of the inventive concept. FIGS. 6A and 6B illustrate elements which operate in a reception operation.

Referring to FIG. 6A, a wireless terminal includes a filter FT and a first receiver RCV1, for processing a reception signal RSIG that is input to the wireless terminal 600a through an antenna ATN. The filter FT may filter the reception signal RSIG, input through the antenna ATN, such that a resulting signal corresponds to a specified frequency band. For example, the filter FT may supply a first reception signal RSIG1, obtained through filtering, to a signal corresponding to a frequency band corresponding to the first receiver RCV1, to the first receiver RCV1. The filter FT may transmit the first reception signal RSIG1 of the first frequency band BA to the first receiver RCV1. If the first receiver RCV1 is included in a transceiver TRC as in a wireless terminal 600b of FIG. 6B, the filter FT may be implemented as a duplexer to protect the first receiver RCV1 from a transmission output in a transmission operation and protect the transmitter TRM (see FIG. 5B) from a reception output in a reception operation.

The first receiver RCV1 includes a first input unit 610, a first amplification unit 620, and a first output unit 630. The first input unit 610 may perform RF matching, such as, for example, impedance matching between the filter FT and the first amplification unit 620, on the first reception signal RSIG1 to supply a first RF input signal RFIN1 to the first amplification unit 620. The first receiver RCV1, according to an embodiment of the inventive concept, may be set in order for the first input unit 610 to perform impedance matching based on one value in various modes, thereby increasing operation efficiency.

The first amplification unit 620 may receive and amplify the first RF input signal RFIN1 to output a first RF output signal RFOUT11 and a first RF output signal RFOUT12. The first amplification unit 620 includes a first amplifier 620a and a first sub amplifier 620b. The first amplification unit 620 may be implemented as a low noise amplifier (LNA). The first amplifier 620a and the first sub amplifier 620b may all be activated in response to a mode signal XMOD, or only the first amplifier 620a may be activated. When the first amplifier 620a and the first sub amplifier 620b are all activated, two output signals (i.e., the first RF output signal RFOUT11 and the first RF output signal RFOUT12) may all be generated. On the other hand, when only the first amplifier 620a is activated, only one the first RF output signal RFOUT11 may be generated.

The first output unit 630 may down-convert the first RF output signal RFOUT11 and the first RF output signal RFOUT12, applied from the first amplification unit 620, to a baseband to output first baseband signals XBAS11 and XBAS12. The first baseband signals XBAS11 and XBAS12 may be transferred to, for example, a data processor. The first output unit 630 includes a first output circuit 630a and a first sub output circuit 630b. The first output circuit 630a may process the first RF output signal RFOUT11 applied from the first amplifier 620a to output the first baseband signal XBAS11 based on the first carrier $\omega 1$. The first sub output circuit 630b may process the first RF output signal RFOUT12 applied from the first sub amplifier 620b to output the first baseband signal XBAS12 based on the second carrier $\omega 2$.

Figure 7A:
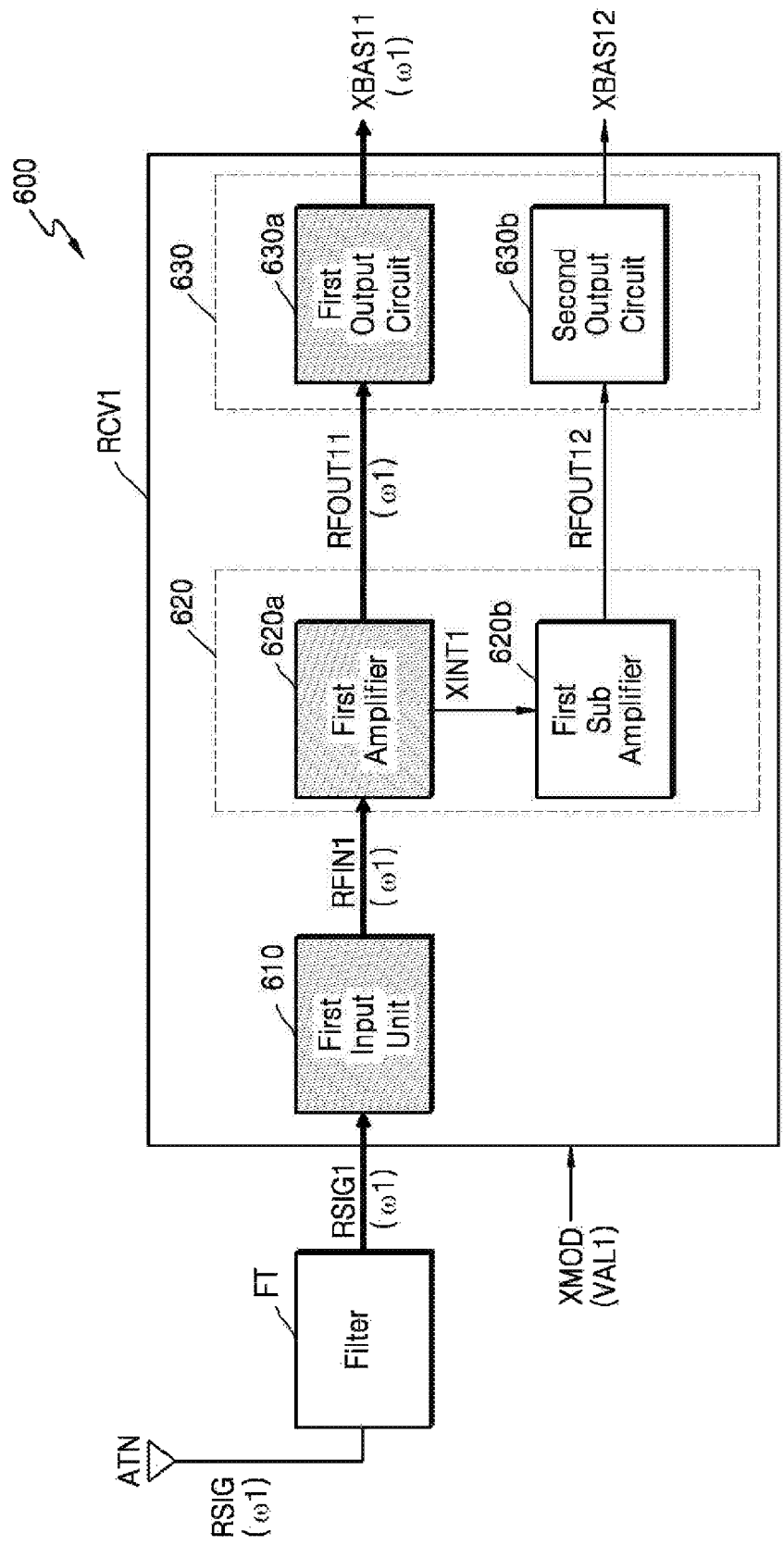
FIGS. 7A to 7C are diagrams illustrating the wireless terminal of FIG. 6A operating in a non-carrier aggregation (CA) mode, an inter-band CA mode, and an intra-band CA mode, according to embodiments of the inventive concept.
Figure 7B:
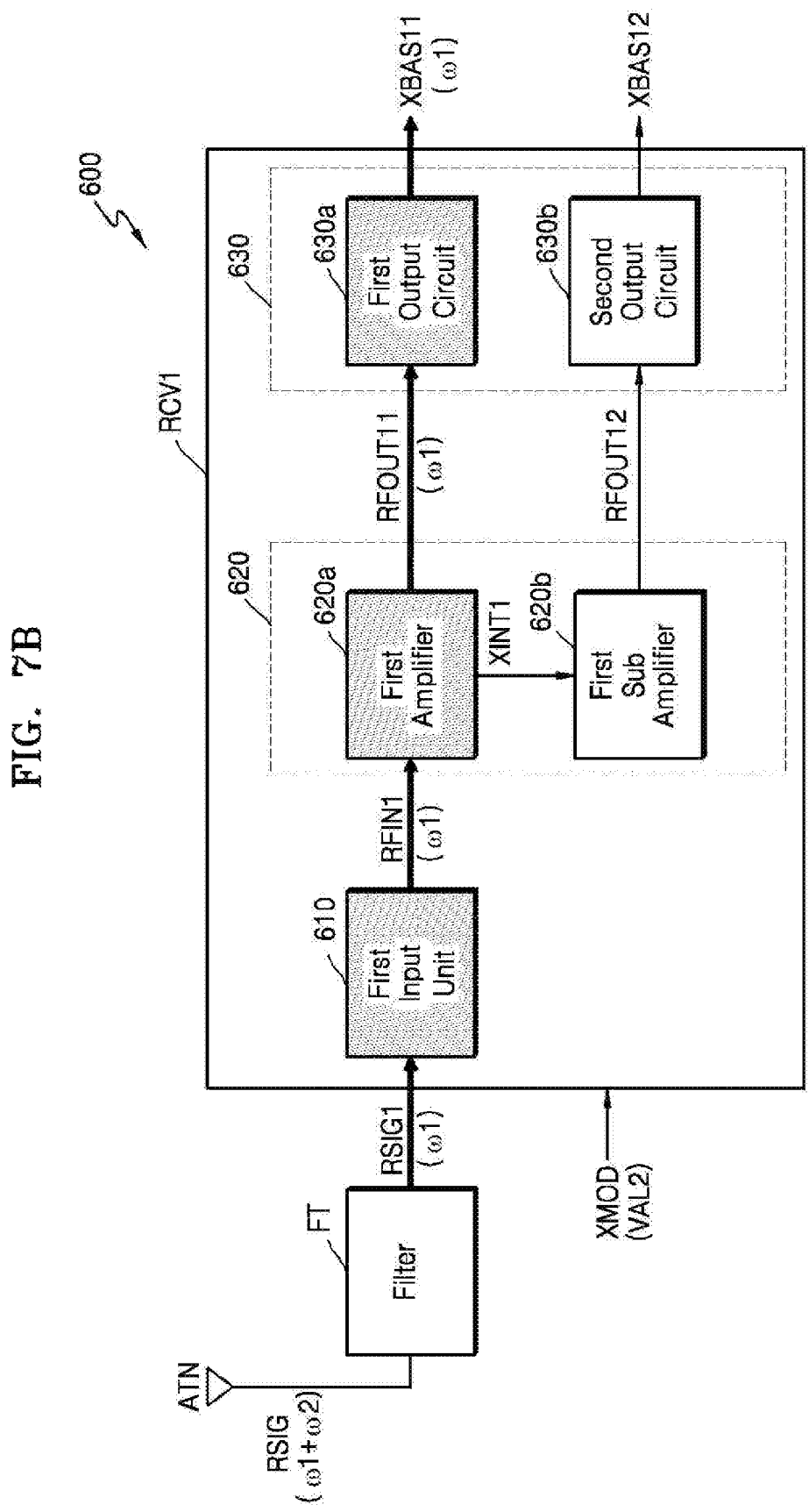
Figure 7C:
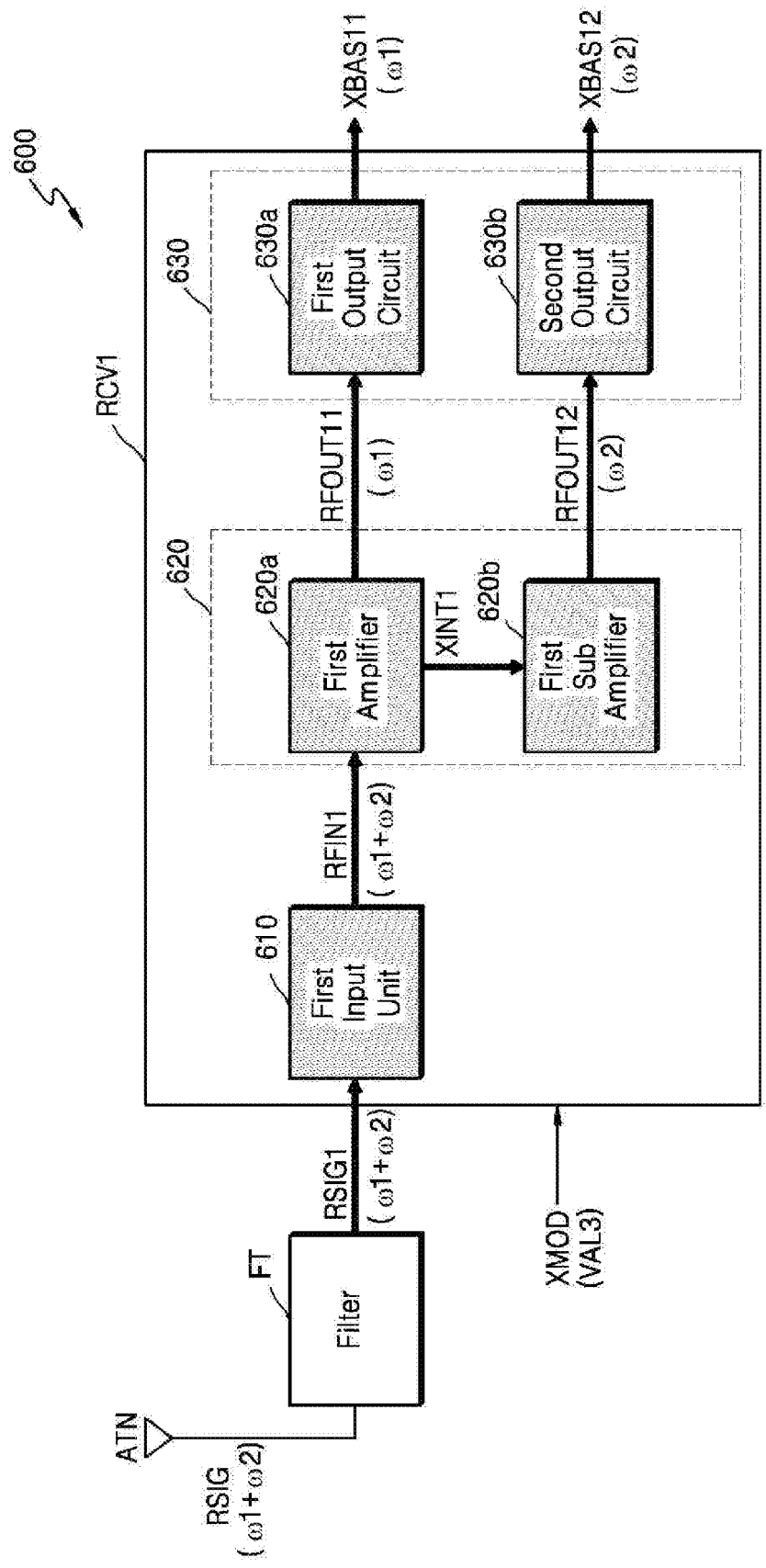

FIGS. 7A to 7C are diagrams illustrating the wireless terminal of FIG. 6A operating in the non-CA mode, the inter-band CA mode, and the intra-band CA mode, according to embodiments of the inventive concept. Details described below may be applied to other wireless terminals in addition to the wireless terminal 600a of FIG. 6A. With respect to FIG. 7A, a case is described in which a reception signal RSIG includes only one carrier (the first carrier $\omega 1$) because the non-CA mode (i.e., the CA technology) is applied. In the non-CA mode, the mode signal XMOD is applied as a first value VAL1. The filter FT supplies the first reception signal RSIG1, obtained by filtering to a signal that corresponds to the first frequency band BA, to the first receiver RCV1. The first input unit 610 of the first receiver RCV1 supplies the first RF input signal RFIN1, generated by performing impedance matching on the first reception signal RSIG1, to the first amplification unit 620. The first amplifier 620a of the first amplification unit 620 amplifies the first RF input signal RFIN1 to output the first RF output signal RFOUT11. The first internal signal XINT1 may be a node voltage of an arbitrary node of the first amplifier 620a, as described in greater detail below. The first output circuit 630a of the first output unit 630 down-converts the first RF output signal RFOUT11, transmitted from the first amplifier 620a, to the baseband to output the first baseband signal XBAS11 corresponding to the first carrier $\omega 1$. The first sub amplifier 620b and the first sub output circuit 630b are deactivated in response to the mode signal XMOD having the first value VAL1.

Hereinafter, the inter-band CA mode, namely, an operation performed in a case of inputting the reception signal RSIG where the first carrier $\omega 1$ and the second carrier $\omega 2$ having different frequency bands are combined, is described with reference to FIG. 7B. In the inter-band CA mode, the mode signal XMOD is applied as a second value VAL2. The filter FT filters the reception signal RSIG individual signals that correspond to each of the frequency bands to supply the first reception signal RSIG1, including the first carrier $\omega 1$ of the first frequency band BA, to the first receiver RCV1. The filter FT transmits a reception signal including the second carrier $\omega 2$ to another receiver. However, the other receiver that processes the reception signal including the second carrier $\omega 2$ operates in the same method, where the first receiver RCV1 processes the first reception signal RSIG1 having the first carrier $\omega 1$.

The first input unit 610 of the first receiver RCV1 supplies the first RF input signal RFIN1, obtained by performing impedance matching on the first reception signal RSIG1 having the first carrier $\omega 1$, to the first amplification unit 620. The first amplifier 620a of the first amplification unit 620 amplifies the first RF input signal RFIN1 to output the first RF output signal RFOUT11. The first output circuit 630a down-converts the first RF output signal RFOUT11 to the baseband to output the first baseband signal XBAS11 corresponding to the first carrier $\omega 1$. The first sub amplifier 620b and the first sub output circuit 630b are deactivated in response to the mode signal XMOD having the second value VAL2. The second value VAL2 may be the same as or different from the first value VAL1.

Hereinafter, the intra-band CA mode, namely, an operation performed when inputting the reception signal RSIG where the first carrier ω1 and the second carrier ω2 having the same frequency band are combined, is described with reference to FIG. 7C. In the intra-band CA mode, the mode signal XMOD is applied as a third value VAL3. The filter FT filters the reception signal RSIG to supply the first reception signal RSIG1, having the first carrier ω1 and the second carrier ω2 included in the first frequency band BA, to the first receiver RCV1.

The first input unit 610 of the first receiver RCV1 supplies the first RF input signal RFIN1, obtained by performing impedance matching on the first reception signal RSIG1, to the first amplification unit 620. The first amplifier 620*a* of the first amplification unit 620 amplifies the first RF input signal RFIN1 to output the first RF output signal RFOUT11. The first sub amplifier 620*b* of the first amplification unit 620 amplifies the first internal signal XINT1 applied from the first amplifier 620*a* to output the first RF output signal RFOUT12. The first internal signal XINT1 may be a node voltage of an arbitrary node of the first amplifier 620*a*, as described in greater detail below. The first output circuit 630*a* of the first output unit 630 down-converts the first RF output signal RFOUT11, transferred from the first amplifier 620*a*, to the baseband to output the first baseband signal XBAS11 corresponding to the first carrier ω1. The first sub output circuit 630*b* of the first output unit 630 down-converts the first RF output signal RFOUT12, output from the first sub amplifier 620*b*, to the baseband to output the first baseband signal XBAS12 corresponding to the second carrier ω2.

FIG. 8 is a diagram illustrating a wireless terminal, according to an embodiment of the inventive concept. Referring to FIG. 8, a wireless terminal 800 includes an antenna ATN, a filter FT, a first receiver RCV1, and a second receiver RCV2. FIG. 8 illustrates elements that operate in a reception operation. The wireless terminal 800 of FIG. 8 may also include one or more other receivers in addition to the first receiver RCV1 and the second receiver RCV2, and at least one of the one or more other receivers may operate identically to the first receiver RCV1 or the second receiver RCV2.

The antenna ATN receives a reception signal RSIG transmitted over the mobile network. The filter FT filters the reception signal RSIG to individual signals that correspond to each of the frequency bands to transfer the reception signal RSIG to an allocated receiver corresponding to each frequency band. For example, the filter FT filters the reception signal RSIG to transfer a first reception signal RSIG1 of the first frequency band BA to the first receiver RCV1 and to transfer a second reception signal RSIG2 of the second frequency band BB to the second receiver RCV2. The filter FT may include a plurality of sub filters that filter the reception signal RSIG to a signal corresponding to each frequency band corresponding thereto.

The first receiver RCV1 includes a first input unit 810_1 and a first amplification unit 820_1. The first input unit 810_1 performs impedance matching on the first reception signal RSIG1 to supply a first RF input signal RFIN1 to the first amplification unit 820_1. The first amplification unit 820_1 receives and amplifies the first RF input signal RFIN1. The first amplification unit 820_1 includes a first amplifier 820_1*a* and a first sub amplifier 820_1*b*, and may be implemented as an LNA.

The second receiver RCV2 may be implemented in the same structure as that of the first receiver RCV1, and includes a second input unit 810_2 and a second amplification unit 820_2. The second input unit 820_2 performs impedance matching on the second reception signal RSIG2 to supply a second RF input signal RFIN2 to the second amplification unit 820_2. The second amplification unit 820_2 receives and amplifies the second RF input signal RFIN2. The second amplification unit 820_2 includes a second amplifier 820_2*a* and a second sub amplifier 820_2*b* and may be implemented as an LNA.

The first receiver RCV1 further includes a first output unit 830_1, and the second receiver RCV2 further includes a second output unit 830_2. The first output unit 830_1 down-converts a first RF output signal RFOUT11 transmitted from the first amplifier 820_1*a* to the baseband to output a first baseband signal XBAS11. Also, the first output unit 830_1 down-converts a second RF output signal RFOUT22 transmitted from the second sub amplifier 820_2*b* to the baseband to output a second baseband signal XBAS22. Likewise, the second output unit 830_2 down-converts a second RF output signal RFOUT21 transmitted from the second amplifier 820_2*a* to the baseband to output a second baseband signal XBAS21. Also, the second output unit 830_2 down-converts a first RF output signal RFOUT12 transmitted from the first sub amplifier 820_1*b* to the baseband to output a first baseband signal XBAS12.

Figure 9A:
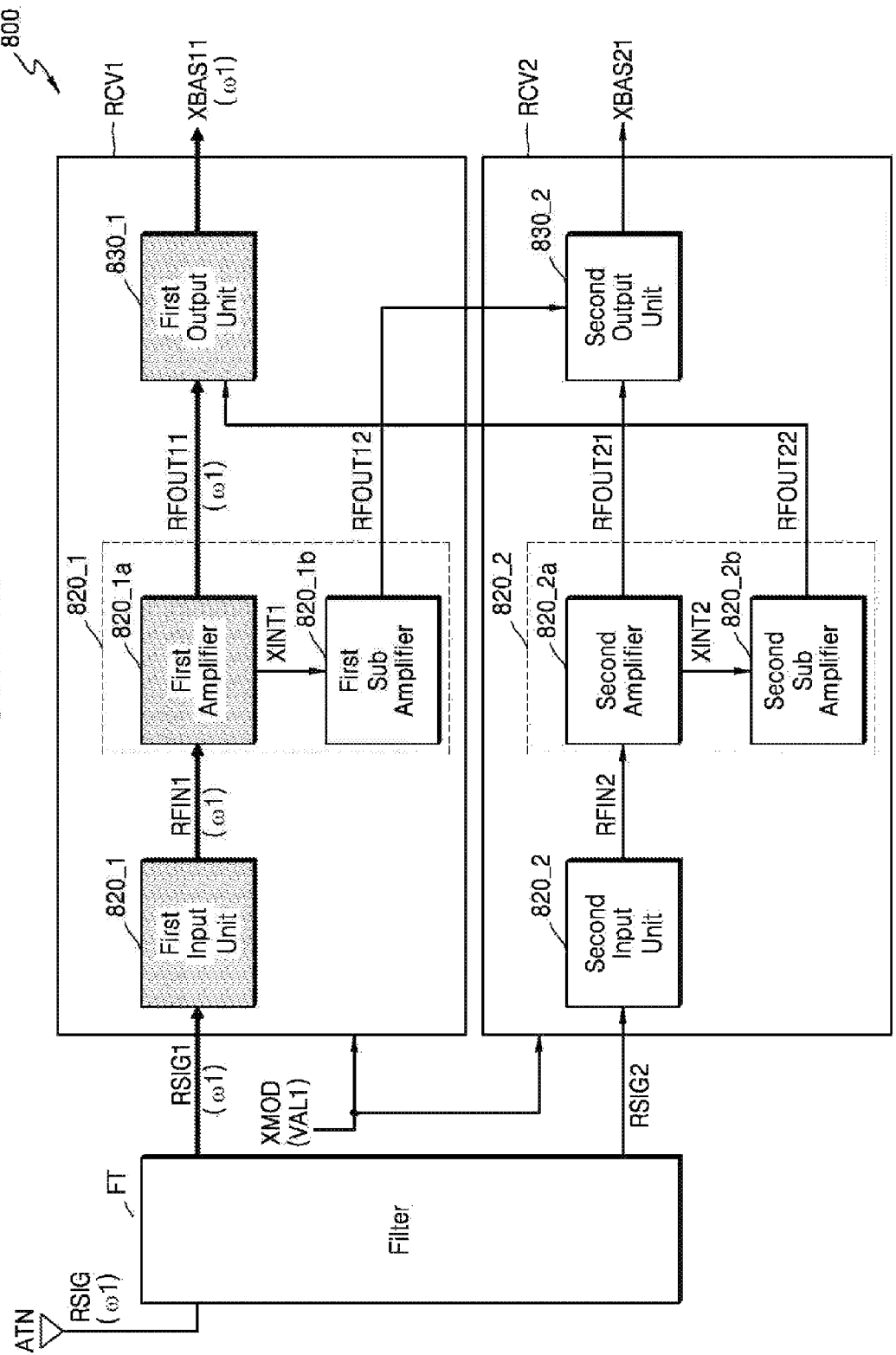
FIGS. 9A to 9C are illustrating the wireless terminal of FIG. 8 operating in the non-CA mode, the inter-band CA mode, and the intra-band CA mode, according to embodiments of the inventive concept.
Figure 9B:
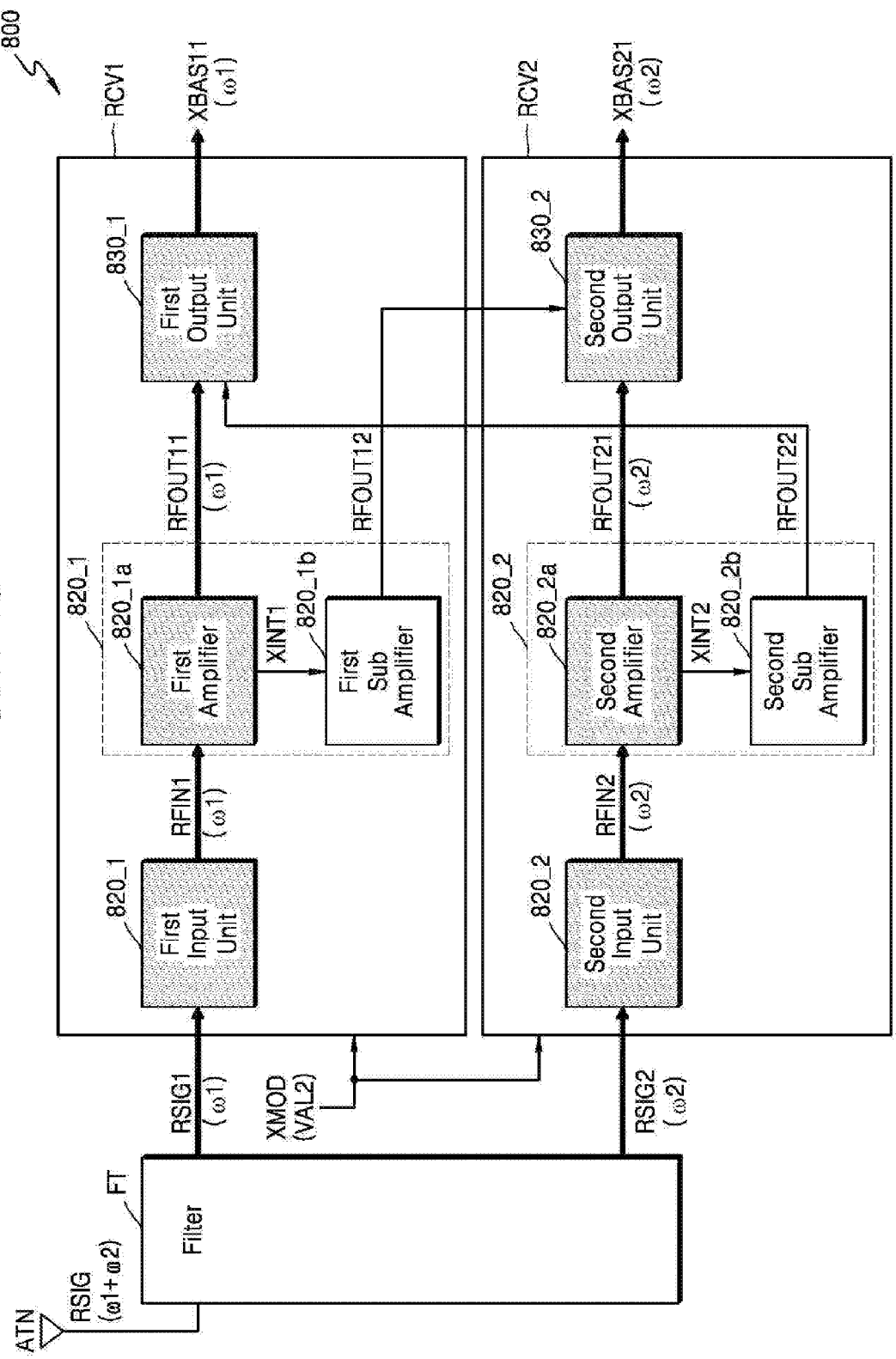
Figure 9C:
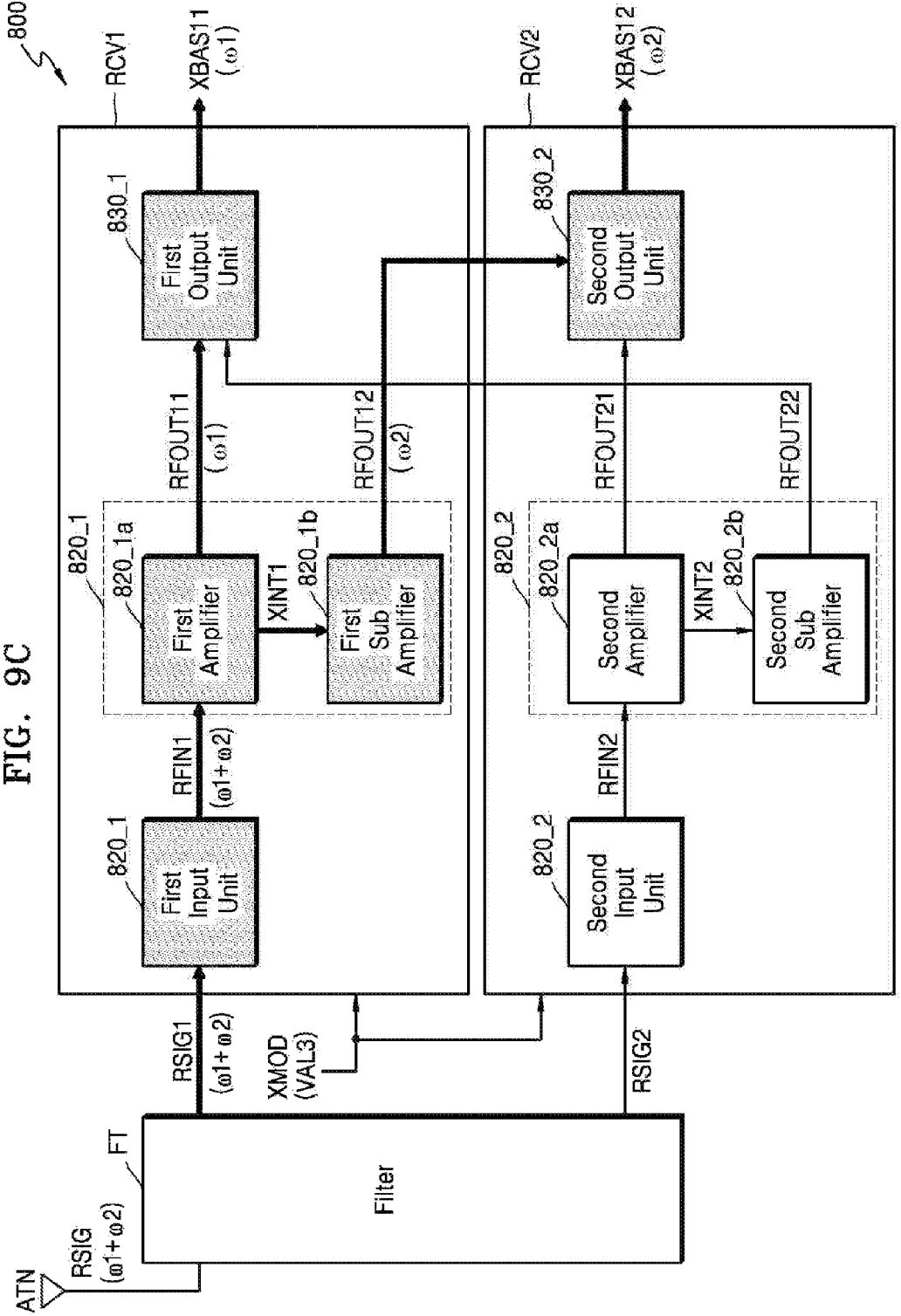

FIGS. 9A to 9C are diagrams illustrating the wireless terminal 800 of FIG. 8 operating in the non-CA mode, the inter-band CA mode, and the intra-band CA mode, according to an embodiment of the inventive concept. Details described below may be applied to other wireless terminals in addition to the wireless terminal 800 of FIG. 8. First, with respect to FIG. 9A, a case is described in which the reception signal RSIG includes only one carrier (the first carrier ω1) because the non-CA mode (i.e., the CA technology) is applied. In the non-CA mode, the mode signal XMOD is applied as the first value VAL1. The filter FT filter the receptions signal RSIG to supply the first reception signal RSIG1 to an allocated first receiver RCV1 corresponding to the first carrier ω1.

The first input unit 810_1 of the first receiver RCV1 supplies the first RF input signal RFIN1, generated by performing impedance matching on the first reception signal RSIG1, to the first amplification unit 820_1. The first amplifier 820_1*a* of the first amplification unit 820_1 amplifies the first RF input signal RFIN1 to output the first RF output signal RFOUT11. The first output unit 830_1 down-converts the first RF output signal RFOUT11 to the baseband to output the first baseband signal XBAS11 corresponding to the first carrier ω1. In this case, the first sub amplifier 820_1*b* of the first receiver RCV1 and the second receiver RCV2 is deactivated in response to the mode signal XMOD having the first value VAL1. In the non-CA mode, the second receiver RCV2 processes the second reception signal RSIG2 applied to the second receiver RCV2 at a time different from a time when the first reception signal RSIG1 is applied to the first receiver RCV1.

Hereinafter, the inter-band CA mode, namely, an operation performed when the reception signal RSIG in input where the first carrier ω1 and the second carrier ω2 having different frequency bands are combined, is described with reference to FIG. 9B. In the inter-band CA mode, the mode signal XMOD is applied as a second value VAL2. The filter FT may filter the reception signal RSIG to individual signals corresponding to each frequency band to supply the first reception signal RSIG1, having the first carrier ω1 of the first frequency band BA, to the first receiver RCV1 and to supply the second reception signal RSIG2, having the second carrier ω2 of the second frequency band BB, to the second receiver RCV2.

The first input unit 810_1 of the first receiver RCV1 performs impedance matching on the first reception signal RSIG1 to supply the first RF input signal RFIN1 to the first amplifier 820_1a, and the second input unit 810_2 of the second receiver RCV2 performs impedance matching on the second reception signal RSIG2 to supply the second RF input signal RFIN2 to the second amplifier 820_2a. The first amplifier 820_1a amplifies the first RF input signal RFIN1 to output the first RF output signal RFOUT11, and the second amplifier 820_2a amplifies the second RF input signal RFIN2 to output the second RF output signal RFOUT21. The first output unit 830_1 down-converts the first RF output signal RFOUT11 to the baseband to output the first baseband signal XBAS11 corresponding to the first carrier ω1, and the second output unit 830_2 down-converts the second RF output signal RFOUT21 to the baseband to output the second baseband signal XBAS21 corresponding to the second carrier ω2. In this case, the first sub amplifier 820_1b of the first receiver RCV1 and the second sub amplifier 820_2b of the second receiver RCV2 are deactivated in response to the mode signal XMOD having the second value VAL2.

Hereinafter, the intra-band CA mode, namely, an operation performed when the reception signal RSIG is input where the first carrier ω1 and the second carrier ω2 have the same frequency band are combined, is described with reference to FIG. 9C. In the intra-band CA mode, the mode signal XMOD is applied as a third value VAL3. The filter FT filters the reception signal RSIG, obtained through modulation based on the first carrier ω1 and the second carrier ω2 included in the first frequency band BA, to supply the first reception signal RSIG1 to the first receiver RCV1.

The first input unit 810_1 of the first receiver RCV1 supplies the first RF input signal RFIN1, obtained by performing impedance matching on the first reception signal RSIG1, to the first amplifier 820_1a. The first input unit 810_1 performs impedance matching on the first reception signal RSIG1 with the same value as that of the non-CA mode and the inter-band CA mode.

The first amplifier 820a_1 amplifies the first RF input signal RFIN1 to transfer the first RF output signal RFOUT11 to the first output unit 830_1. The first output unit 830_1 down-converts the first RF output signal RFOUT11, transferred from the first amplifier 820_1a, to the baseband to output the first baseband signal XBAS11 corresponding to the first carrier ω1. The first internal signal XINT1 is transferred from the first amplifier 820_1a to the first sub amplifier 820_1b. The first sub amplifier 820_1b amplifies the first internal signal XINT1 to output the first RF output signal RFOUT12 to the second output unit 830_2. The second output unit 830_2 down-converts the first RF output signal RFOUT12, transferred from the first sub amplifier 820_1b, to the baseband to output the first baseband signal XBAS12 corresponding to the second carrier ω2. The second input unit 820_1 and second amplification unit 820_2 of the second receiver RCV2 are deactivated in response to the mode signal XMOD having the third value VAL3.

Figure 10:
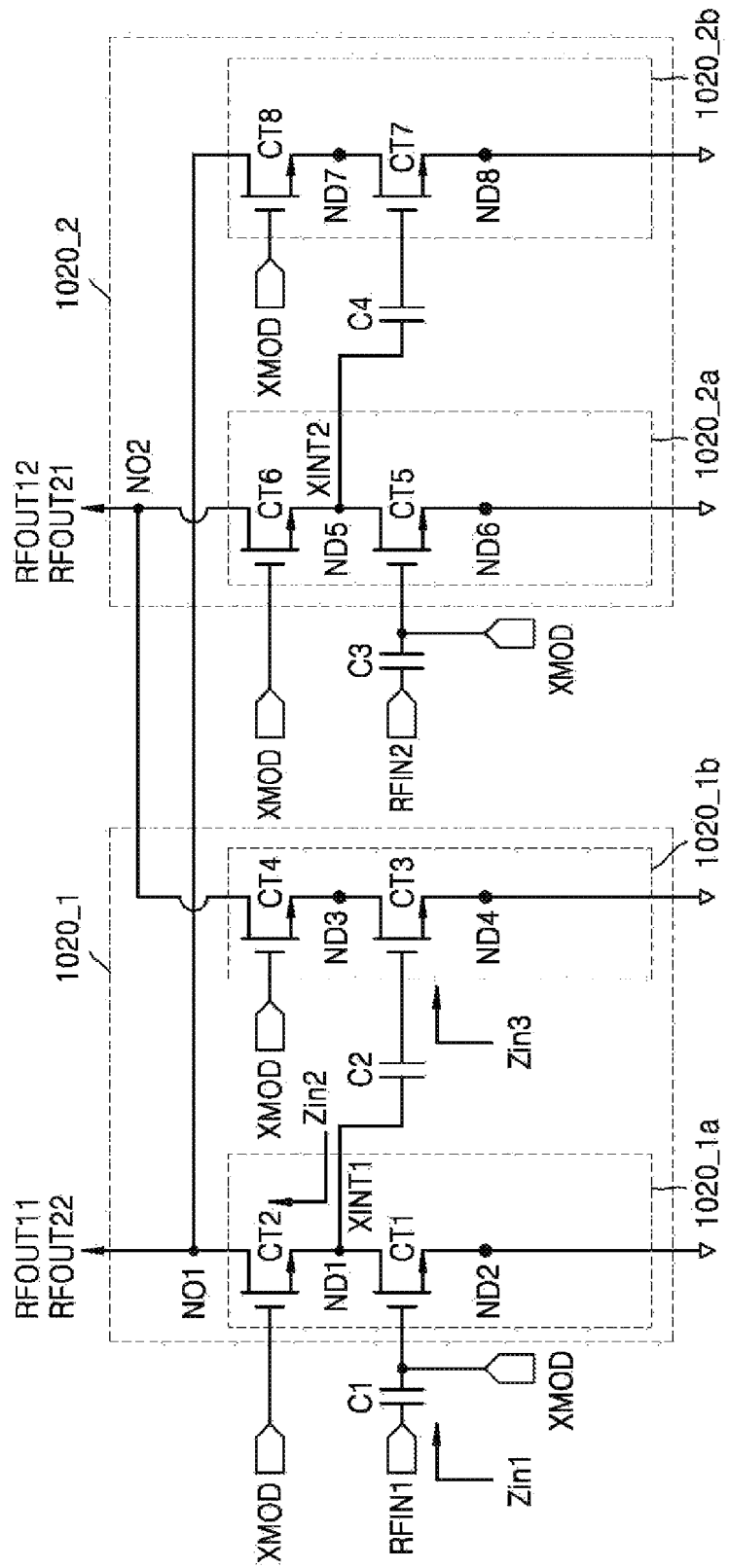
FIG. 10 is a diagram illustrating an example of each of a first amplification unit and a second amplification unit illustrated in FIG. 8, according to an embodiment of the inventive concept.

FIG. 10 is a diagram illustrating the first amplification unit and the second amplification unit illustrated in FIG. 8, according to an embodiment of the inventive concept. Referring to FIG. 10, a first amplification unit 1020_1 includes a first amplifier 1020_1a and a first sub amplifier 1020_1b, and a second amplification unit 1020_2 includes a second amplifier 1020_2a and a second sub amplifier 1020_2b.

The first amplifier 1020_1a includes a first transistor CT1 and a second transistor CT2. The first transistor CT1 is connected between a first node ND1 and a second node ND2, and when the mode signal XMOD having a logic high level H is applied to the first transistor CT1, the first RF input signal RFIN1 is applied to a gate of the first transistor CT1. The second transistor CT2 is connected between the first node ND1 and a first output node NO1, and the mode signal XMOD is applied to a gate of the second transistor CT2. A source of the second transistor CT2 is connected to the first node ND1 and a drain of the first transistor CT1. The first RF output signal RFOUT11 generated by amplifying the first RF input signal RFIN1 is output from the first output node NO1 connected to a drain of the second transistor CT2.

The first transistor CT1 and the second transistor CT2 may each be implemented as a cascode transistor. Specifically, the first transistor CT1 and the second transistor CT2 may be implemented as a cascode amplifier where the first transistor CT1 is serially connected to the second transistor CT2, the first transistor CT1 is an input terminal and operates as a common source amplifier, and the second transistor CT2 is an output terminal and operates as a common gate amplifier.

A node voltage of the first node ND1 is supplied to the first sub amplifier 1020_1b. As described above, the first internal signal XINT1 may be the node voltage of the first node ND1. The first sub amplifier 1020_1b includes a third transistor CT3 and a fourth transistor CT4. The third transistor CT3 is connected between a third node ND3 and a fourth node ND4, and the first internal signal XINT1 is applied to a gate of the third transistor CT3. The fourth transistor CT4 is connected between the third node ND3 and a second output node NO2, and the mode signal XMOD is applied to a gate of the fourth transistor CT4. A source of the fourth transistor CT4 is connected to the third node ND3 and a drain of the third transistor CT3. The first RF output signal RFOUT12, generated by amplifying the first internal signal XINT1, is output from the second output node NO2 connected to a drain of the fourth transistor CT4.

The third transistor CT3 and the fourth transistor CT4 may each be implemented as a cascode transistor. That is, the third transistor CT3 and the fourth transistor CT4 may be implemented as a cascode amplifier where the third transistor CT3 is serially connected to the fourth transistor CT4, the third transistor CT3 is an input terminal and operates as a common source amplifier, and the fourth transistor CT4 is an output terminal and operates as a common gate amplifier.

Since the first sub amplifier 1020_1b is connected to the first node ND1 of the first amplifier 1020_1a, namely, since the first RF input signal RFIN1 is applied to only one input terminal regardless of a mode, impedance Zin1 as seen from an input terminal of the first amplification unit 1020_1 may be affected by only the first transistor CT1 (Zin1=1/gm1, where gm1 is a transconductance of the first transistor CT1). Therefore, the impedance Zin1 as seen from the input terminal of the first amplification unit 1020_1 may be constant regardless of activation of the first sub amplifier 1020_1b. As described above, the first sub amplifier 1020_1b may be activated in only the intra-band CA mode, and may not be activated in the other modes. As described above, since the impedance Zin1 as seen from the input terminal of the first amplification unit 1020_1 is constant irrespective of the modes, loss caused by impedance matching based on each of the modes is reduced.

Moreover, the first transistor CT1 may be larger in size than the second transistor CT2. Therefore, an absolute value of a voltage gain "Av" at the first node ND1 may be 1 or more. The voltage gain "Av" at the first node ND1 may be expressed as "-gm1/gm2". Here, gm1 denotes the transconductance of the first transistor CT1, and gm2 denotes a transconductance of the second transistor CT2. Therefore, the first internal signal XINT1 applied to the first sub amplifier 1020_1*b* may have a voltage higher than that of the first RF input signal RFIN1 due to the voltage gain at the first node ND1. That is, the first sub amplifier 1020_1*b* may receive and amplify the first internal signal XINT1 higher than the first RF input signal RFIN1, and thus, despite consumption of a direct current (DC) current being reduced, the first RF output signal RFOUT12 having the same level as that of the first RF output signal RFOUT11 may be output. Accordingly, power consumption is reduced.

Moreover, a noise feature is enhanced due to a voltage gain. A noise feature of the first amplification unit 1020_1 may correspond to a sum "NS1+NS3/Av" of a noise feature "NS1" of the first transistor CT1 and a value "NS3/Av" which is obtained by dividing a noise feature "NS3" of the third transistor CT3 by the voltage gain "Av". Therefore, as a voltage gain increases, a noise feature from the first amplification unit 1020_1 to the second output node NO2 is maintained in comparison with a noise feature of a signal path where the first RF output signal RFOUT11 is generated.

Moreover, since the first transistor CT1 is larger in size than the second transistor CT2, a voltage gain at the first node ND1 between the first transistor CT1 and the second transistor CT2 is obtained. Also, a gate input impedance Zin3 of the third transistor CT3 may be far higher than a source input impedance Zin2 of the second transistor CT2. Thus, a current is not leaked in a direction from the first node ND1 to a gate of the third transistor CT3. Accordingly, a voltage gain of a signal path where the first RF output signal RFOUT11 is generated is not lost.

Specifically, a current is not leaked in the direction from the first node ND1 to the third transistor CT3. Therefore, a leakage current does not occur in a path through which the first RF output signal RFOUT11, based on the first carrier ω1, is output, and thus, the first RF output signal RFOUT11 is accurately generated. The second amplifier 1020_2*a* may be implemented in the same structure as that of the first amplifier 1020_1*a*. The second amplifier 1020_2*a* includes a fifth transistor CT5 and a sixth transistor CT6. The fifth transistor CT5 is connected between a fifth node ND5 and a sixth node ND6, and when the mode signal XMOD having a logic high level H is applied to the fifth transistor CT5, the second RF input signal RFIN2 is applied to a gate of the fifth transistor CT5. The sixth transistor CT6 is connected between the fifth node ND5 and a second output node NO2, and the mode signal XMOD is applied to a gate of the sixth transistor CT6. A source of the sixth transistor CT6 is connected to the fifth node ND5 and a drain of the fifth transistor CT5. The second RF output signal RFOUT21 generated by amplifying the second RF input signal RFIN2 is output from the second output node NO2 connected to a drain of the sixth transistor CT6.

The fifth transistor CT5 and the sixth transistor CT6 may each be implemented as a cascode transistor. That is, the fifth transistor CT5 and the sixth transistor CT6 may be implemented as a cascode amplifier where the fifth transistor CT5 is serially connected to the sixth transistor CT6, the fifth transistor CT5 is an input terminal and operates as a common source amplifier, and the sixth transistor CT6 is an output terminal and operates as a common gate amplifier.

A node voltage of the fifth node ND5 is supplied to the second sub amplifier 1020_2*b*. The node voltage of the fifth node ND5 may be referred to as a second internal signal XINT2. The second sub amplifier 1020_2*b* may be implemented as having the same structure as that of the first sub amplifier 1020_1*b*. The second sub amplifier 1020_2*b* includes a seventh transistor CT7 and an eighth transistor CT8. The seventh transistor CT7 is connected between a seventh node ND7 and an eighth node ND8, and the second internal signal XINT2 is applied to a gate of the seventh transistor CT7. The eighth transistor CT8 is connected between the seventh node ND7 and the first output node NO1, and the mode signal XMOD is applied to a gate of the eighth transistor CT8. A source of the eighth transistor CT8 is connected to the seventh node ND7 and a drain of the seventh transistor CT7. The second RF output signal RFOUT22 generated by amplifying the second internal signal XINT2 is output from the first output node NO1 connected to the drain of the eighth transistor CT8.

The seventh transistor CT7 and the eighth transistor CT8 may each be implemented as a cascode transistor. That is, the seventh transistor CT7 and the eighth transistor CT8 may be implemented as a cascode amplifier where the seventh transistor CT7 is serially connected to the eighth transistor CT8, the seventh transistor CT7 is an input terminal and operates as a common source amplifier, and the eighth transistor CT8 is an output terminal and operates as a common gate amplifier.

Impedance, as seen from an input terminal of the second amplification unit 1020_2, may be constant regardless of each of the modes, and the fifth transistor CT5 of the second amplifier 1020_2*a* may be larger in size than the sixth transistor CT6, thereby reducing power consumption or enhancing a noise feature. Furthermore, sizes of the first transistor CT1, the third transistor CT3, the fifth transistor CT5, and the seventh transistor CT7 may be the same, and sizes of the second transistor CT2, the fourth transistor CT4, the sixth transistor CT6, and the eighth transistor CT8 may be the same.

In order to perform gate biasing of each of the input terminals, the first amplification unit 1020_1 further includes a first capacitor C1 connected to a gate of the first transistor CT1 and a second capacitor C2 connected to a gate of the third transistor CT3. The second amplification unit 1020_2 further includes a third capacitor C3 connected to a gate of the fifth transistor CT5 and a fourth capacitor C4 connected to a gate of the seventh transistor CT7.

In FIG. 10 and as described in detail below, the mode signal XMOD applied to each of the transistors CT1 to CT7 is identically illustrated, but the mode signal XMOD may be applied at the same level or different levels to each of the transistors CT1 to CT7.

Figure 11A:
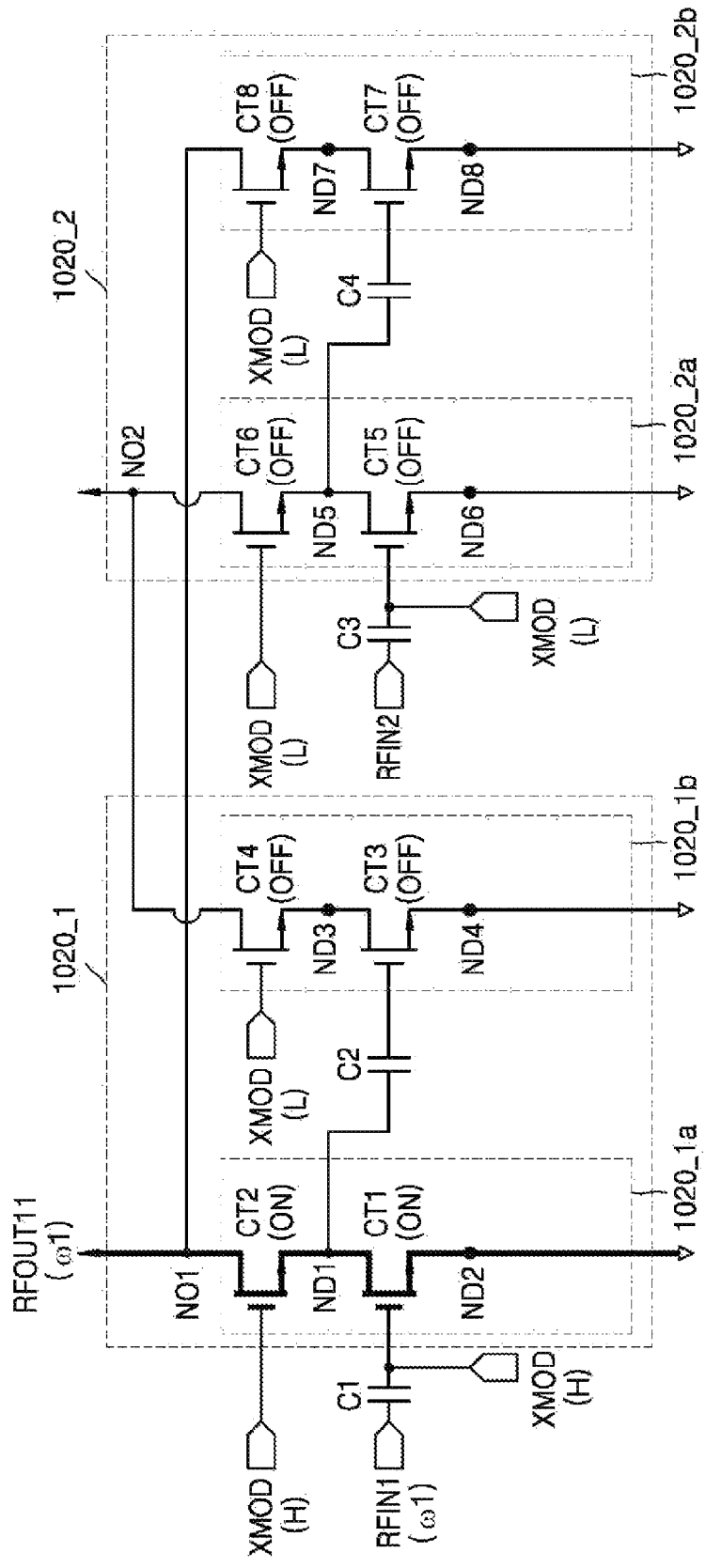
FIGS. 11A to 11C are diagrams illustrating the first and second amplification units of FIG. 10 operating in the non-CA mode, the inter-band CA mode, and the intra-band CA mode, according to embodiments of the inventive concept.
Figure 11B:
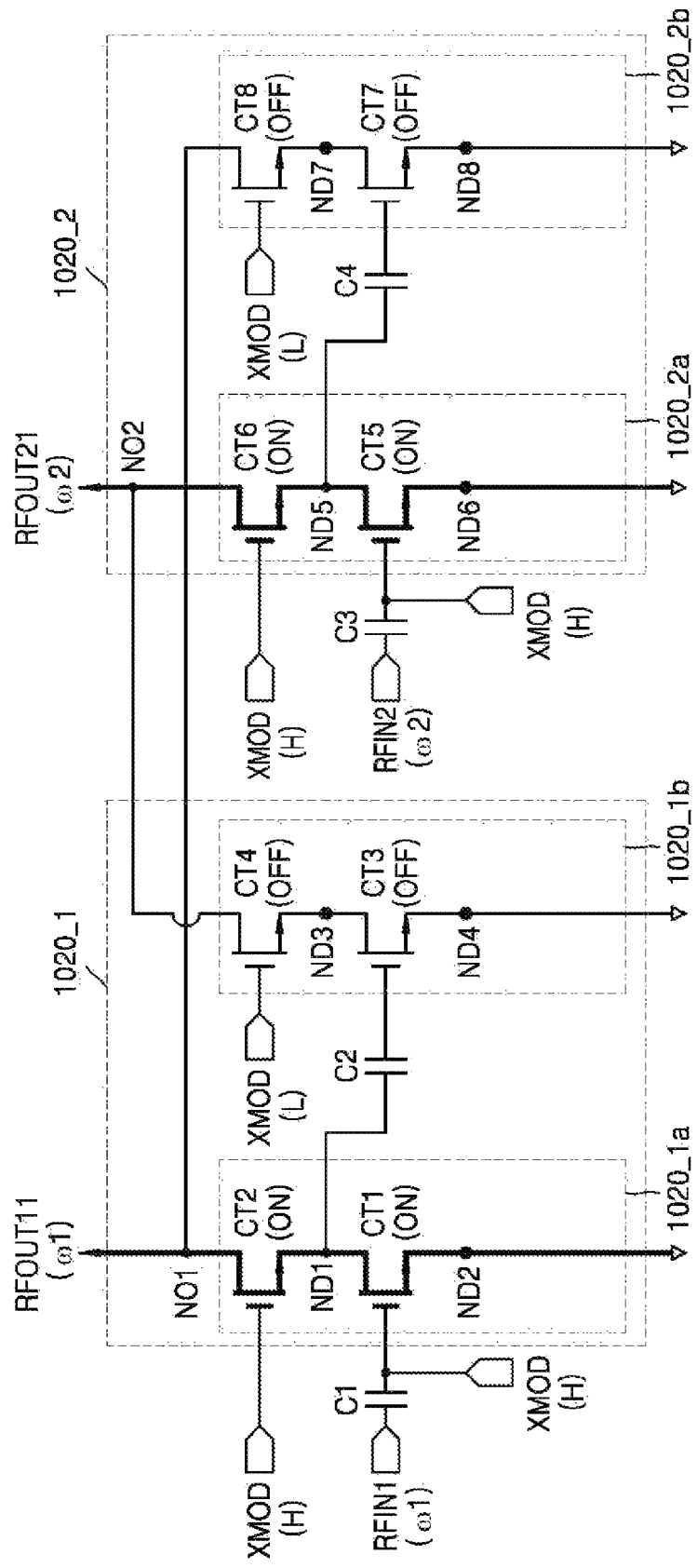
Figure 11C:
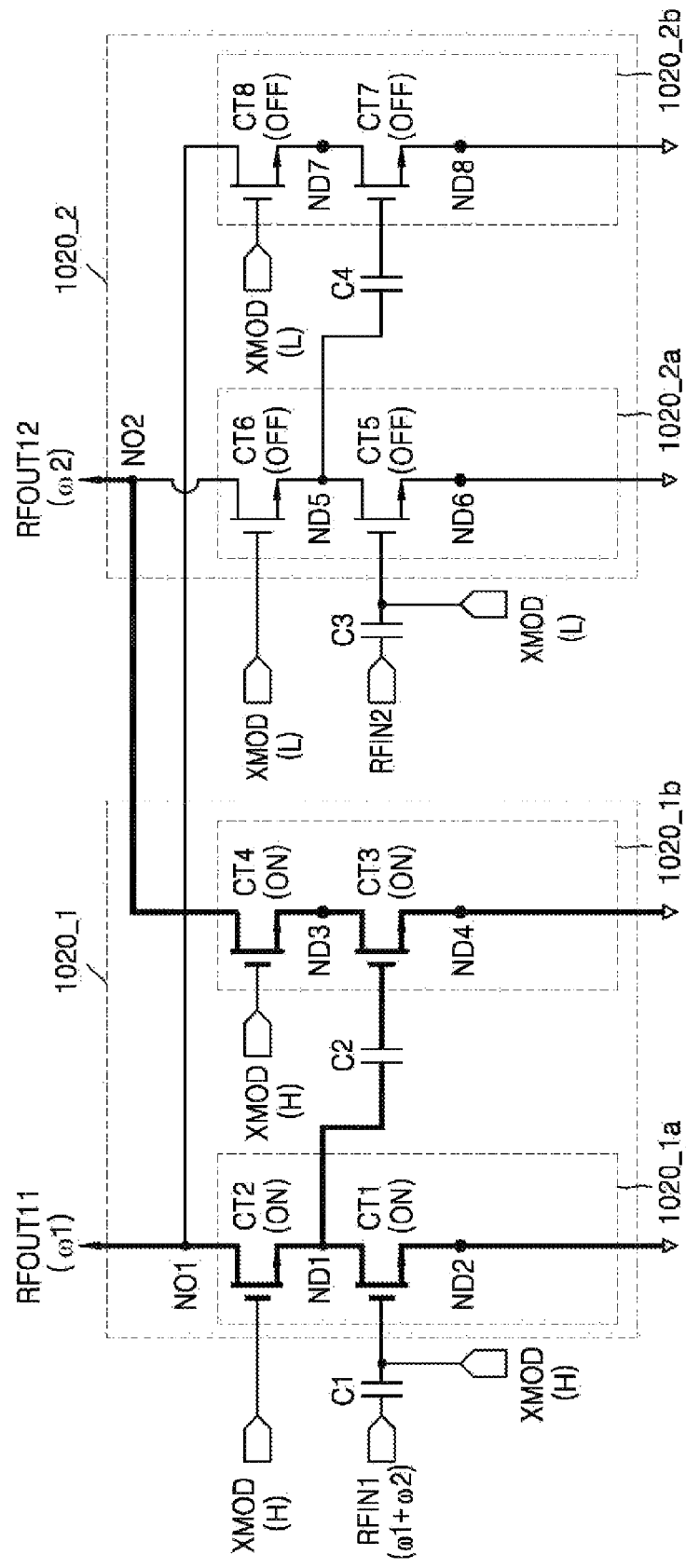

FIGS. 11A to 11C are diagrams illustrating the first and second amplification units of FIG. 10 operating in the non-CA mode, the inter-band CA mode, and the intra-band CA mode, according to embodiments of the inventive concept. First, referring to FIG. 11A, in the non-CA mode, the first RF input signal RFIN1, including the first carrier ω1 to which the CA technology is not applied, is transferred to the first transistor CT1 of the first amplifier 1020_1*a*. In the non-CA mode, the mode signal XMOD applied to the first and second transistors CT1 and CT2 is set to a logic high level H, and the mode signal XMOD applied to the fourth to sixth transistors CT4 to CT6 and the eighth transistor CT8 is set to a logic low level L. Therefore, only the first and second transistors CT1 and CT2 are turned on, and the other transistors CT3 to CT8 are turned off. The first and second transistors CT1 and CT2 amplify the first RF input signal RFIN1 to output the first RF output signal RFOUT11 to the first output node NO1.

Referring to FIG. 11B, in the inter-band CA mode, the first RF input signal RFIN1, including the first carrier ω1 among the first carrier ω1 and the second carrier ω2 having different frequency bands, is transferred to the first transistor CT1 of the first amplifier 1020_1a, and the second RF input signal RFIN2, including the second carrier ω2, is transferred to the fifth transistor CT5 of the second amplifier 1020_2a. In the first inter-band CA mode of the first receiver RCV1, the mode signal XMOD applied to the first transistor CT1, the second transistor CT2, the fifth transistor CT5, and the sixth transistor CT6 is set to a logic high level H, and the mode signal XMOD applied to the fourth transistor CT4 and the eighth transistor CT8 is set to a logic low level L. Therefore, only the first transistor CT1, the second transistor CT2, the fifth transistor CT5, and the sixth transistor CT6 are turned on, and the other transistors CT3, CT4, CT7 and CT8 are turned off. The first and second transistors CT1 and CT2 amplify the first RF input signal RFIN1 to output the first RF output signal RFOUT11 to the first output node NO1. The fifth and sixth transistors CT5 and CT6 amplify the second RF input signal RFIN2 to output the second RF output signal RFOUT21 to the second output node NO2.

Sizes of the first and fifth transistors CT1 and CT5 may be the same, and thus, as described above, the impedance Zin1 as seen from the input terminal of the first amplification unit 1020_1 in the non-CA mode and the inter-band CA mode may be equal to the impedance Zin5 as seen from the input terminal of the second amplification unit 1020_2 in the inter-band CA mode.

Referring to FIG. 11C, in the intra-band CA mode, the first RF input signal RFIN1, including the first carrier ω1 and second carrier ω2 of the same frequency band, is transferred to the first transistor CT1 of the first amplifier 1020_1a. In the first intra-band CA mode, the mode signal XMOD applied to the first transistor CT1, the second transistor CT2, and the fourth transistor CT4 is set to a logic high level H, and the mode signal XMOD applied to the fifth transistor CT5, the sixth transistor CT6, and the eighth transistor CT8 is set to a logic low level L. Also, the node voltage of the first node ND1, which is obtained by amplifying the first RF input signal RFIN1 including the first carrier ω1 and the second carrier ω2 according to a voltage gain, is applied as the first internal signal XINT1 to the third transistor CT3. Therefore, only the first transistor CT1, the second transistor CT2, the third transistor CT3, and the fourth transistor CT4 may be turned on, and the other transistors CT5 to CT8 may be turned off.

The first and second transistors CT1 and CT2 amplify the first RF input signal RFIN1 to output the first RF output signal RFOUT11 to the first output node NO1, and the third and fourth transistors CT3 and CT4 amplify the first internal signal XINT1 to output the first RF output signal RFOUT12 to the second output node NO2. The first RF output signal RFOUT11 generated from the first RF input signal RFIN1 is an RF output signal based on the first carrier ω1 constituting the first RF input signal RFIN1. The first RF output signal RFOUT12 generated from the first RF input signal RFIN1 is an RF output signal based on the second carrier ω2 constituting the first RF input signal RFIN1.

The impedance Zin1, as seen from the input terminal of the first amplification unit 1020_1 in the intra-band CA mode, may be equal to impedance in the non-CA mode and the inter-band CA mode. Also, as described above, since the first transistor CT1 is larger in size than the second transistor CT2, a leakage current does not occur in a path (a first path) through which the first RF output signal RFOUT11 based on the first carrier ω1 is output. Also, a path (a second path) through which the first RF output signal RFOUT12, based on the second carrier ω2, is output may operate according to an input (the first internal signal XINT1) higher in voltage level than the first path, thereby reducing power consumption and enhancing a noise feature.

An example in which the first receiver RCV1 operates in the non-CA mode and the intra-band CA mode has been described in detail above, however, the embodiments of the inventive concept are not limited thereto. The reception signal RSIG, which includes the first carrier ω1 and second carrier ω2 of the same frequency band and is received by the antenna ATN of FIG. 8, may be transferred as the second reception signal RSIG2 to the second receiver RCV2 through the filter FT.

Figure 12:
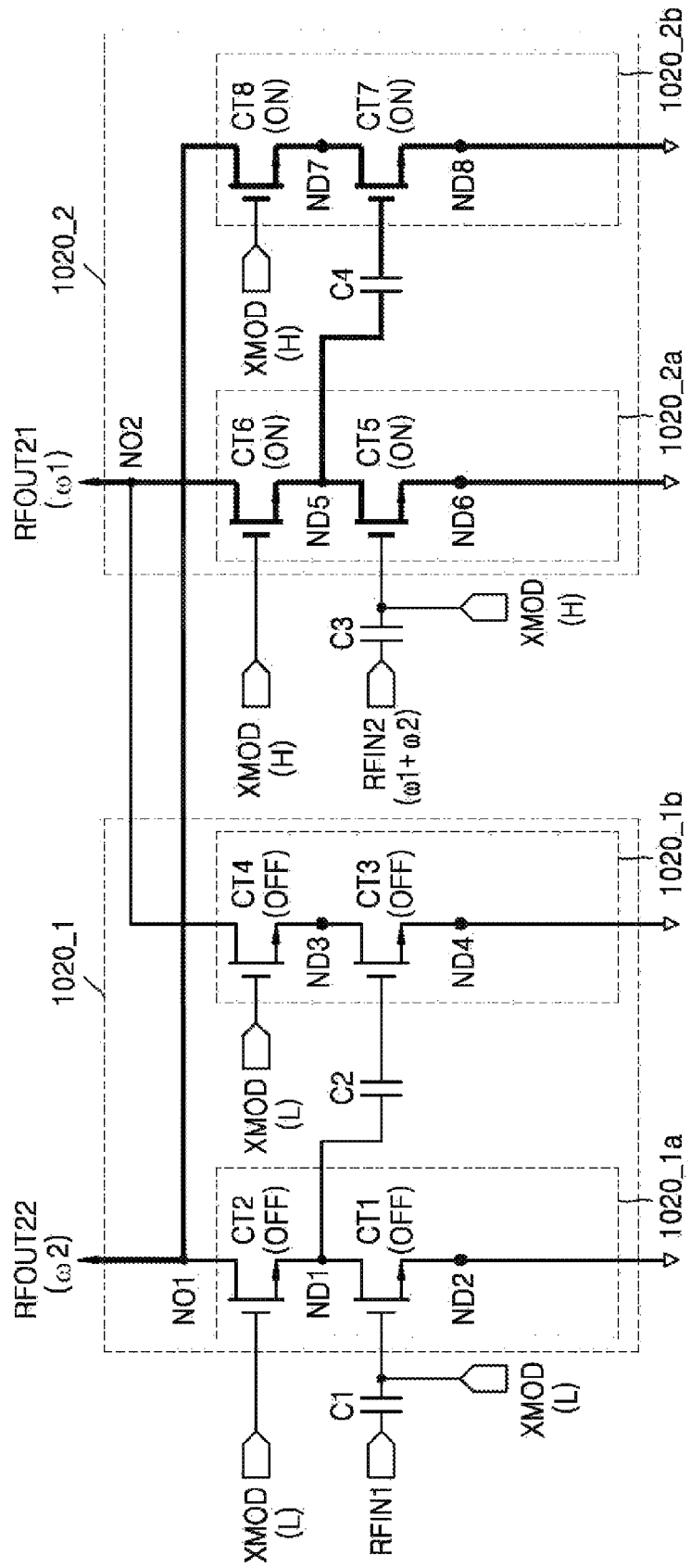
FIG. 12 is a diagram illustrating the first and second amplification units of FIG. 10 operating in the intra-band CA mode, according to an embodiment of the inventive concept.

Referring to FIG. 12, a diagram illustrates the first and second amplification units of FIG. 10 operating in the intra-band CA mode, according to an embodiment of the inventive concept. The second RF input signal RFIN2 is applied to the fifth transistor CT5. Also, the mode signal XMOD applied to the fifth transistor CT5, the sixth transistor CT6, and the eighth transistor CT8 is set to a logic high level H, and the mode signal XMOD applied to the first transistor CT1, the second transistor CT2, and the fourth transistor CT4 is set to a logic low level L. Further, a node voltage of the fifth node ND5, which is obtained by amplifying the second RF input signal RFIN2, including the first carrier ω1 and the second carrier ω2 according to a voltage gain, is applied as the second internal signal XINT2 to the seventh transistor CT7. Therefore, only the fifth transistor CT5, the sixth transistor CT6, the seventh transistor CT7, and the eighth transistor CT8 are turned on, and the other transistors CT1 to CT4 are turned off.

The fifth and sixth transistors CT5 and CT6 amplify the second RF input signal RFIN2 to output the second RF output signal RFOUT21 to the second output node NO2. The seventh and eighth transistors CT7 and CT8 amplify the second internal signal XINT2 to output the second RF output signal RFOUT22 to the first output node NO1. The second RF output signal RFOUT21, generated from the second RF input signal RFIN2, is an RF output signal based on the first carrier ω1 constituting the second RF input signal RFIN2. The second RF output signal RFOUT22, generated from the second RF input signal RFIN2, is an RF output signal based on the second carrier ω2 constituting the second RF input signal RFIN2.

Figure 13:
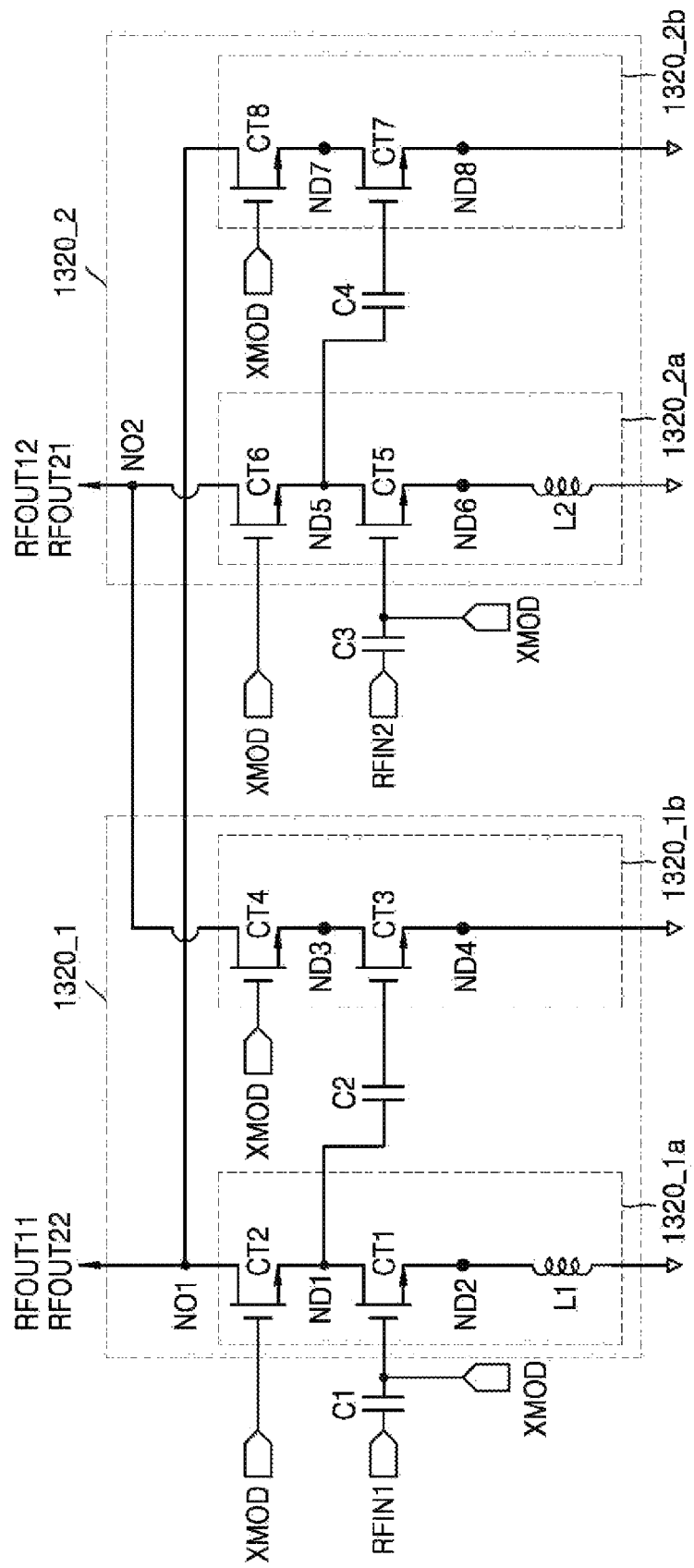
FIGS. 13 to 17 are diagrams illustrating the first amplification unit and the second amplification unit of FIG. 8, according to embodiments of the inventive concept.

FIGS. 13 to 17 are diagrams illustrating the first amplification unit and the second amplification unit of in FIG. 8, according to an embodiment of the inventive concept. Referring to FIG. 13, a first amplification unit 1320_includes a first amplifier 1320_1a and a first sub amplifier 1320_1b, and a second amplification unit 1320_2 includes a second amplifier 1320_2a and a second sub amplifier 1320_2b. The first amplification unit 1320_1 and the second amplification unit 1320_2 include first to eighth transistors CT1 to CT8. Also, in order to perform gate biasing of each of input terminals of the first amplification unit 1320_1 and the second amplification unit 1320_2, the first amplification unit 1320_1 further includes a first capacitor C1 connected to a gate of the first transistor CT1 and a second capacitor C2 connected to a gate of the third transistor CT3, and the second amplification unit 1320_2 further includes a third capacitor C3 connected to a gate of the fifth transistor CT5 and a fourth capacitor C4 connected to a gate of the seventh transistor CT7.

In addition, the first amplification unit 1320_1 further includes a first inductor L1, and the second amplification unit 1320_2 further includes a second inductor L2. Each of the first and second inductors L1 and L2 may be a source degeneration inductor. The first inductor L1 is connected between a source of the first transistor CT1 and a ground terminal, and the second inductor L2 is connected between a source of the fifth transistor CT5 and the ground terminal. The first inductor L1 enables impedance matching to be performed for enhancing a noise feature of the first amplifier 1320_1a, thereby enhancing a linearity of an amplification operation of the first amplifier 1320_1a. Likewise, the second inductor L2 decreases an interaction between the second amplifier 1320_2a and the second sub amplifier 1320_2b, prevents a noise feature from being degraded, and enhances a linearity of an amplification operation of the second amplifier 1320_2a. The first and second inductors L1 and L2 may be the same or may differ. For example, if an interaction between the first amplifier 1320_1a and the first sub amplifier 1320_1b is the same as the interaction between the second amplifier 1320_2a and the second sub amplifier 1320_2b, the first and second inductors L1 and L2 may be set to the same value.

Figure 14:
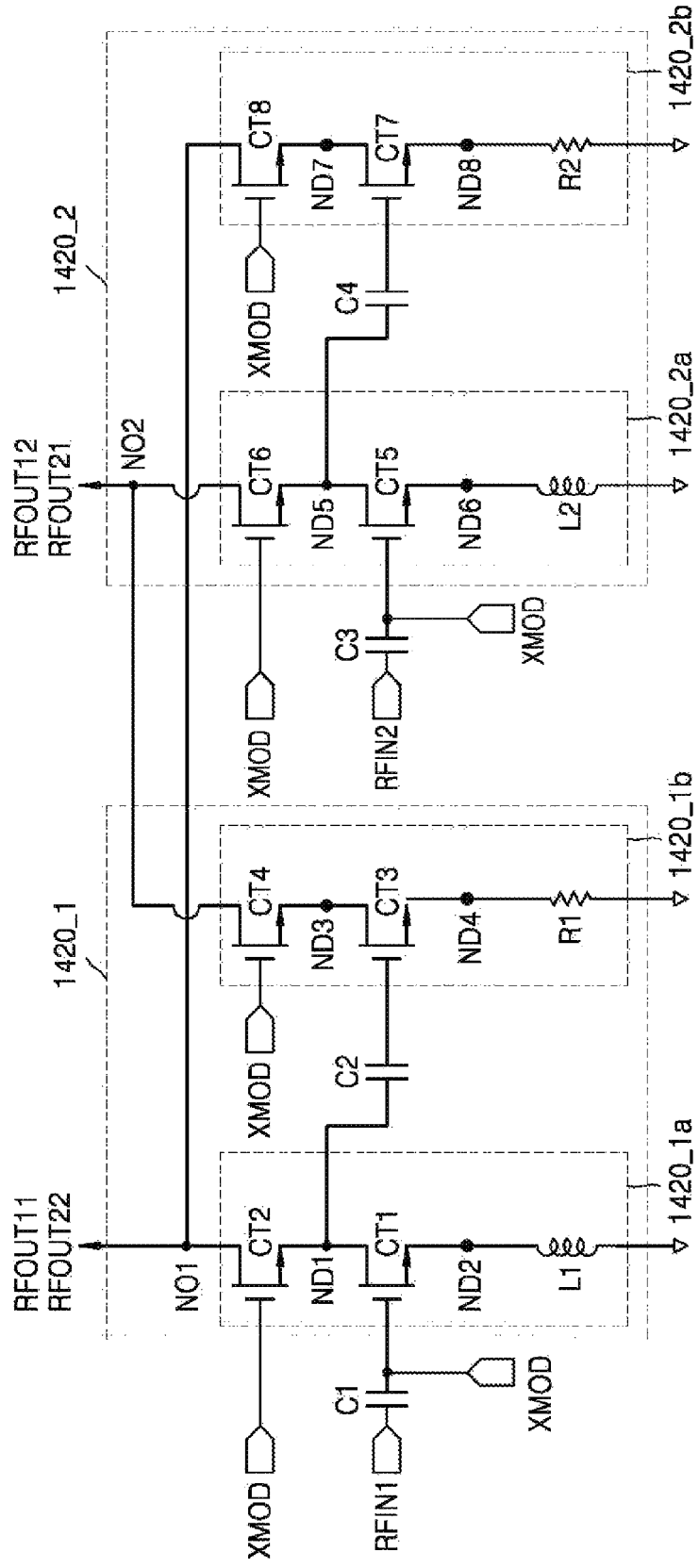

Referring to FIG. 14, a first amplification unit 1420_1 includes a first amplifier 1420_1a and a first sub amplifier 1420_1b, and a second amplification unit 1420_2 includes a second amplifier 1420_2a and a second sub amplifier 1420_2b. The first amplification unit 1420_1 further includes a first inductor L1 between a first transistor CT1 and a ground terminal, and the second amplification unit 1420_2 further includes a second inductor L2 between a fifth transistor CT5 and the ground terminal. Also, in order to perform gate biasing of each of input terminals of the first amplification unit 1420_1 and the second amplification unit 1420_2, the first amplification unit 1420_1 further includes a first capacitor C1 connected to a gate of the first transistor CT1 and a second capacitor C2 connected to a gate of a third transistor CT3, and the second amplification unit 1420_2 further includes a third capacitor C3 connected to a gate of the fifth transistor CT5 and a fourth capacitor C4 connected to a gate of a seventh transistor CT7.

In addition, the first amplification unit 1420_1 further includes a first resistor R1 along with the first inductor L1. The first inductor L1 is connected between the first transistor CT1 of the first amplifier 1420_1a and the ground terminal, and the first resistor R1 is connected between the third transistor CT3 of the first sub amplifier 1420_1b and the ground terminal. The second inductor L2 is connected between the fifth transistor CT5 of the second amplifier 1420_2a and the ground terminal, and the second resistor R2 is connected between the seventh transistor CT7 of the second sub amplifier 1420_2b and the ground terminal. A gain of the first amplification unit 1420_1 may be controlled by the first resistor R1, and a gain of the second amplification unit 1420_2 may be controlled by the second resistor R2. However, embodiments of the inventive concept are not limited thereto. In other embodiments, the first sub amplifier 1420_1b may include an inductor, instead of the first resistor R1, between the third transistor CT3 and the ground terminal, and the second sub amplifier 1420_2b may include an inductor, instead of the second resistor R2, between the seventh transistor CT7 and the ground terminal.

Figure 15:
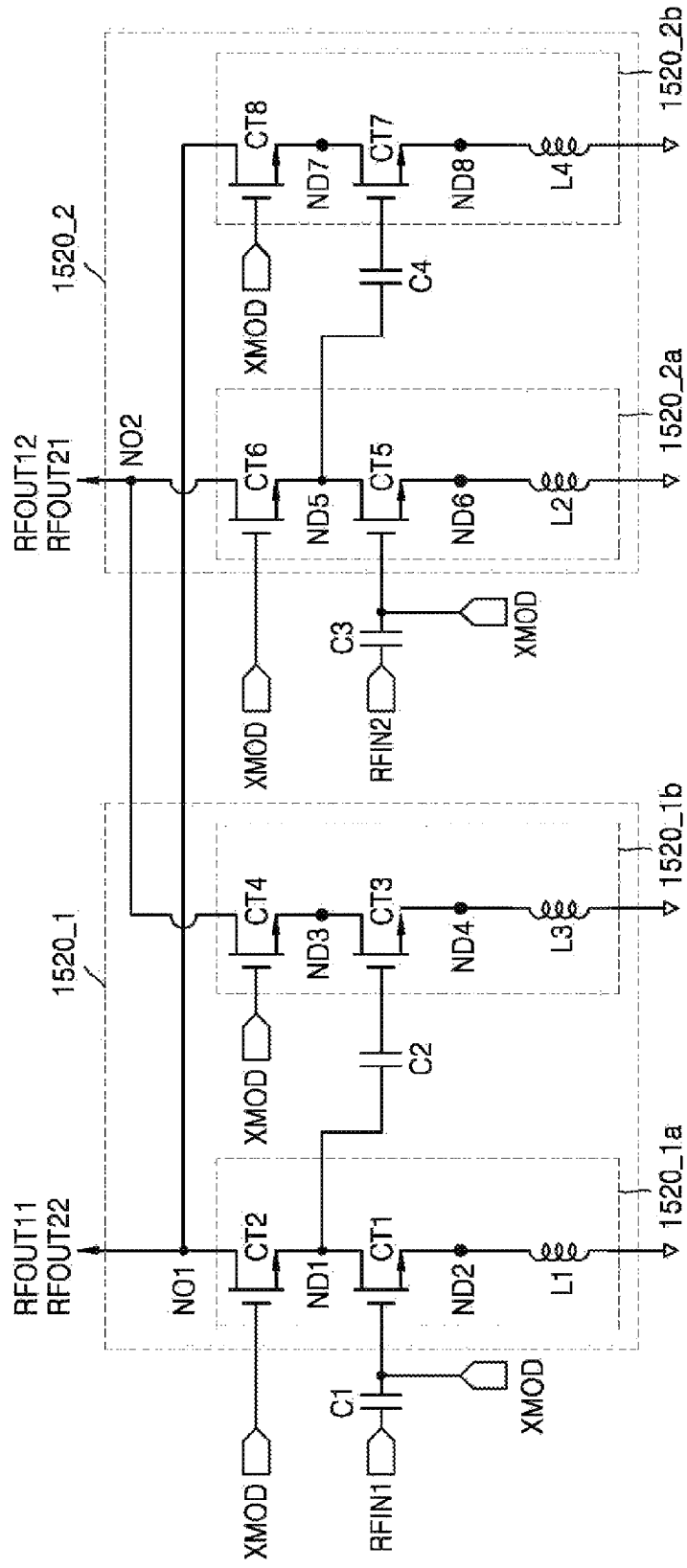

Referring to FIG. 15, a first amplification unit 1520_1 includes a first amplifier 1520_1a and a first sub amplifier 1520_1b, and a second amplification unit 1520_2 includes a second amplifier 1520_2a and a second sub amplifier 1520_2b. The first amplification unit 1520_1 and the second amplification unit 1520_2 further include first to eighth transistors CT1 to CT8. Also, in order to perform gate biasing of each of the input terminals of the first amplification unit 1520_1 and the second amplification unit 1520_2, the first amplification unit 1520_1 further includes a first capacitor C1 connected to a gate of the first transistor CT1 and a second capacitor C2 connected to a gate of the third transistor CT3, and the second amplification unit 1520_2 further includes a third capacitor C3 connected to a gate of the fifth transistor CT5 and a fourth capacitor C4 connected to a gate of the seventh transistor CT7. Furthermore, the first amplification unit 1520_1 further includes a first inductor L1 between the first transistor CT1 and the ground terminal and a third inductor L3 between the third transistor CT3 and the ground terminal, and the second amplification unit 1520_2 further includes a second inductor L2 between the fifth transistor CT5 and the ground terminal and a fourth inductor L4 between the seventh transistor CT7 and the ground terminal.

Figure 16:
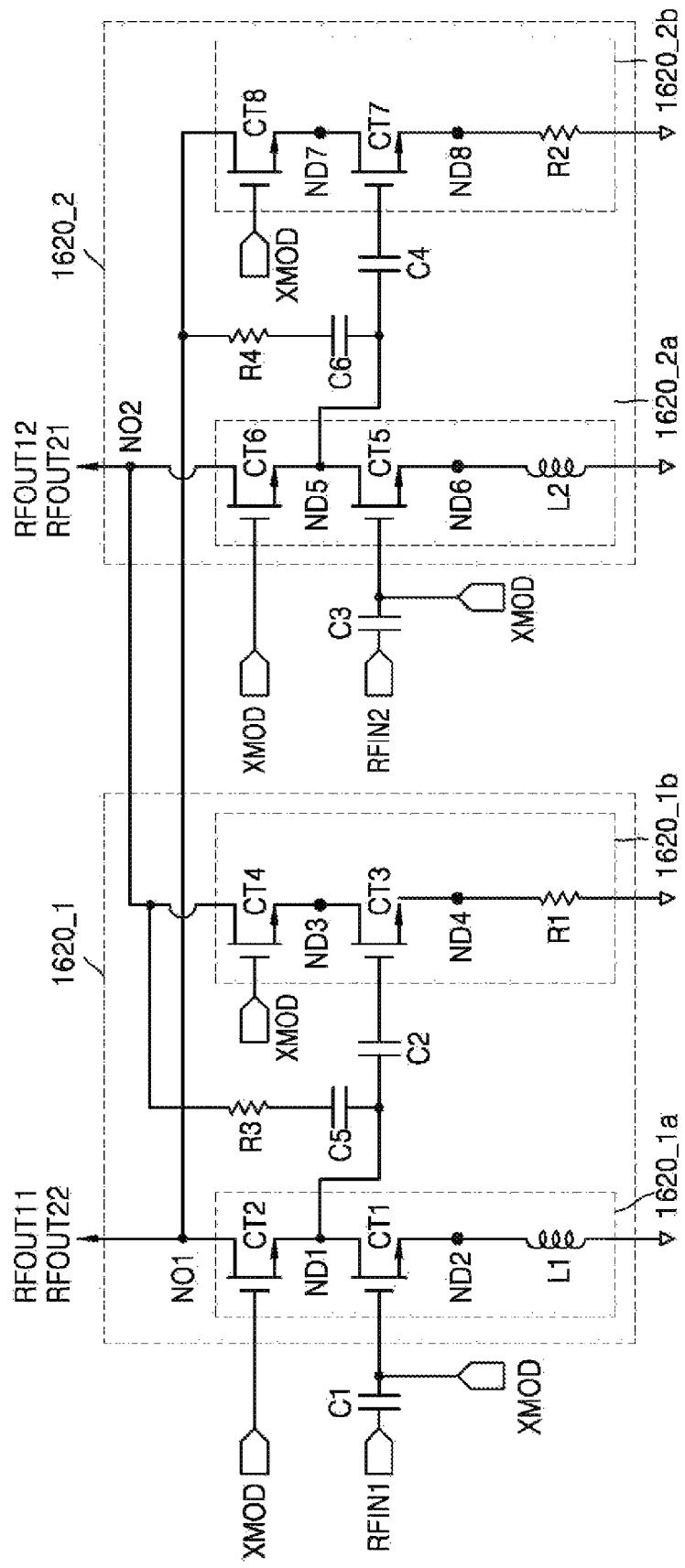

Referring to FIG. 16, a first amplification unit 1620_1 includes a first amplifier 1620_1a and a first sub amplifier 1620_1b, and a second amplification unit 1620_2 includes a second amplifier 1620_2a and a second sub amplifier 1620_2b. The first amplification unit 1620_1 includes a first inductor L1 between a first transistor CT1 and a ground terminal and a first resistor R1 between a third transistor CT3 and the ground terminal, and the second amplification unit 1620_2 includes a second inductor L2 between a fifth transistor CT5 and the ground terminal and a second resistor R2 between a seventh transistor CT7 and the ground terminal. Furthermore, the first amplification unit 1620_1 further includes a third resistor R3 and a fifth capacitor C5, which are serially connected between a first node ND1 and a second output node NO2. The second amplification unit 1620_2 further includes a fourth resistor R4 and a sixth capacitor C6, which are serially connected between a fifth node ND5 and a first output node NO1. Similar to the first and second resistors R1 and R2, a path (a feedback circuit) from the first output node NO1 to the internal first node ND1 adjusts a current at the first node NO1 to control a gain of the first amplification unit 1620_1, and a path (a feedback circuit) from the second output node NO2 to an internal fifth node ND5 adjusts a current at the second node NO2 to control a gain of the second amplification unit 1620_2.

Figure 17:
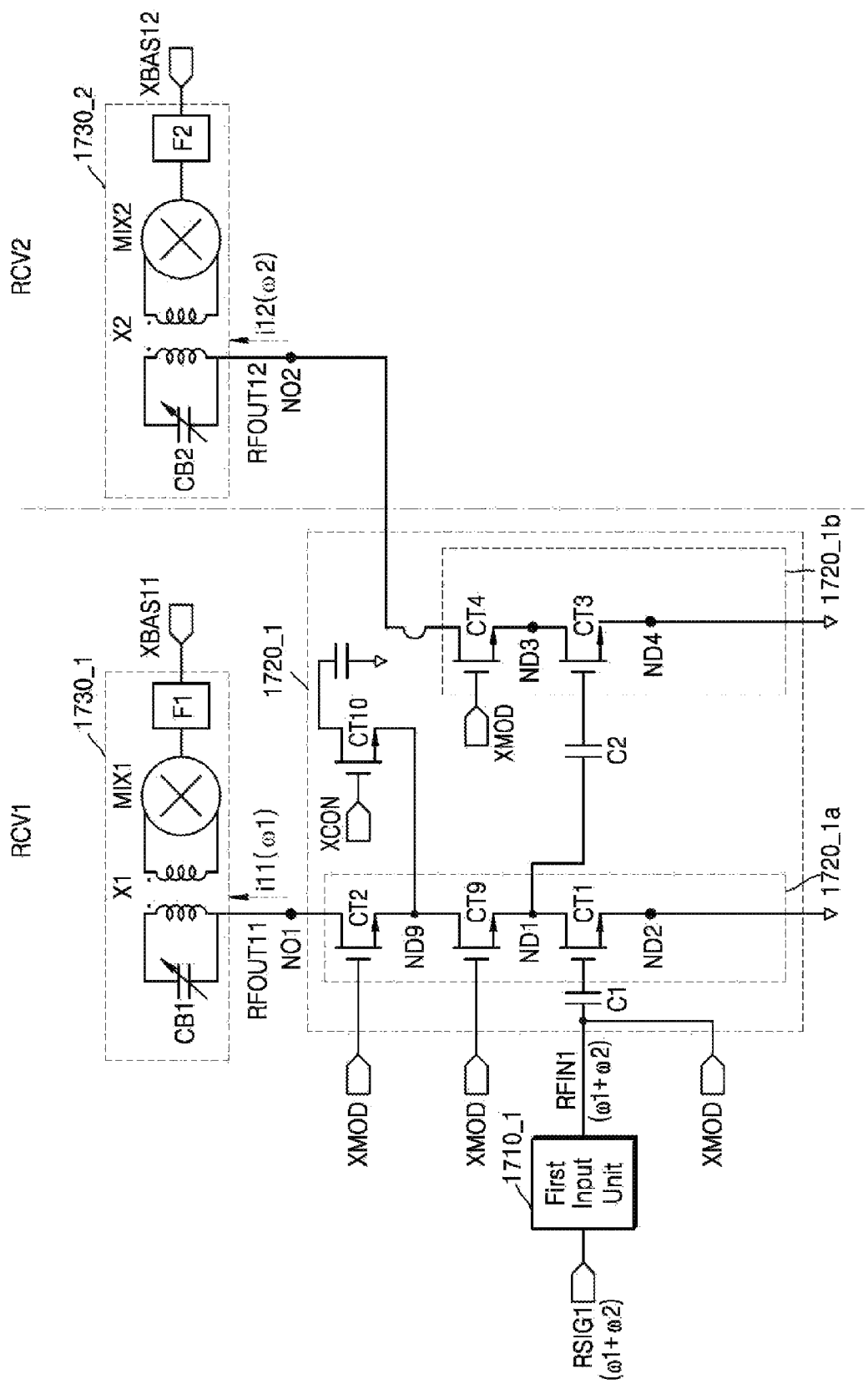

FIG. 17 is a diagram illustrating a first receiver RCV1, according to another embodiment of the inventive concept. Referring to FIG. 17, the first receiver RCV1 includes a first input unit 1710_1, a first amplification unit 1720_1, and a first output unit 1730_1. The first input unit 1710_1 receives a first reception signal RSIG1. In the intra-band CA mode, the first reception signal RSIG1 includes a first carrier ω1 and a second carrier ω2 of the same frequency band. The first input unit 1710_1 performs impedance matching on the first reception signal RSIG1 to transfer a first RF input signal RFIN1 to the first amplification unit 1720_1.

The first amplification unit 1720_1 includes a first amplifier 1720_1a and a first sub amplifier 1720_1b. The first amplifier 1720_1a includes a first transistor CT1, a second transistor CT2. The first sub amplifier 1720_1b includes a third transistor CT3, a fourth transistor CT4. The first to fourth transistors CT1 to CT4, the first inductor L1, and the first resistor R1 are as described in detail above, and thus, their detailed descriptions are not repeated. However, a source of the second transistor CT2 is connected to a ninth node ND9 instead of a first node ND1. Also, the first amplification unit 1720_1 further includes at least one of a ninth transistor CT9, connected between the first node ND1 and the ninth node ND9, and a tenth transistor CT10 having a source connected to the ninth node ND9. In FIG. 17, the ninth and tenth transistors CT9 and CT10 are all provided, however, embodiments of the inventive concept are not limited thereto.

When the first carrier ω1 and the second carrier ω2 are transmitted from different base stations, and the first reception signal RSIG1 into which the first carrier ω1 and the second carrier ω2 are aggregated is amplified, a gain of the first amplification unit 1720_1 may be controlled. For example, if the first carrier ω1 is a signal received from a base station, which is located close to a wireless terminal including the first receiver RCV1, a gain (i.e., a level) of a first RF output signal RFOUT11 based on the first carrier ω1 may be reduced.

In this case, a gain control signal XCON is applied at a high logic level H, and the tenth transistor CT10 is turned on. Therefore, a current i11 supplied from a first output node NO1 to the first output unit 1730_1 is reduced, and thus, a gain is controlled. However, when an RF input signal having a high frequency is processed, a voltage gain of the ninth node ND9 may be changed due to a parasitic capacitor between a source and a drain of the second transistor CT2. The ninth transistor CT9 is disposed between the first node ND1 and the ninth node ND9 to perform a function of a buffer, and thus, a voltage gain of the first node ND1 is maintained without being changed. That is, even when a gain of a first current path to the first output node NO1 through the first amplifier 1720_1a is controlled, the voltage gain of the first node ND1 is maintained, and thus, the first sub amplifier 1720_1b is not affected by the gain control. Therefore, a second current i12 supplied to a second output node NO2 is maintained without being changed. An operation of the first sub amplifier 1720_1b is as described in detail above.

The first output unit 1730_1 includes a first converter X1, a first capacitor bank CB1, a first mixer MIX1, and a first baseband filter F1. The first converter X1 generates signals that are different from the first RF output signal RFOUT11 applied from the first output node NO1, and provides a resonance value corresponding to an RF frequency (a first carrier) desired by the first capacitor bank CB1 to block other signals. The first mixer MIX1 is connected to the first converter X1 to down-convert a signal transferred from the first converter X1. The first baseband filter F1 filters a signal, obtained through the down-conversion, to a first baseband signal XBAS11. A second output unit 1730_2 included in a second receiver RCV2 may be implemented in the same structure as that of the first output unit 1730_1 of the first receiver RCV1. For example, the second output unit 1730_2 may include a second converter X2, a second capacitor bank CB2, a second mixer MIX2, and a second baseband filter F2. The second output unit 1730_2 receives a first RF output signal RFOUT12 supplied from the second output node NO2 to output a first baseband signal XBAS12.

Furthermore, the first amplification unit 1720_1 further includes a first capacitor C1 and a second capacitor C2 that perform gate biasing on the first and third transistors CT1 and CT3.

Figure 18:
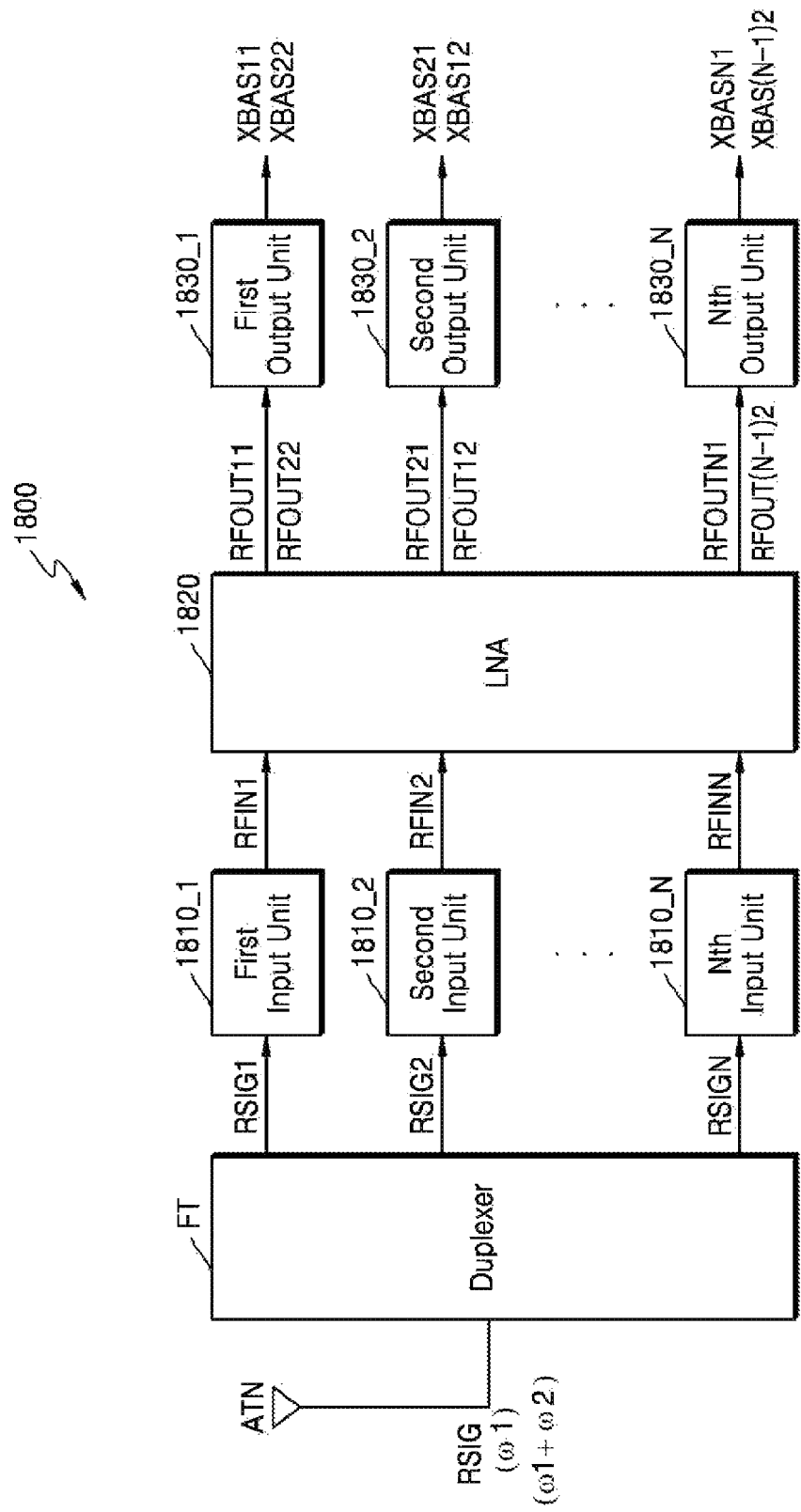
FIG. 18 is a diagram illustrating a wireless terminal, according to an embodiment of the inventive concept.
Figure 19:
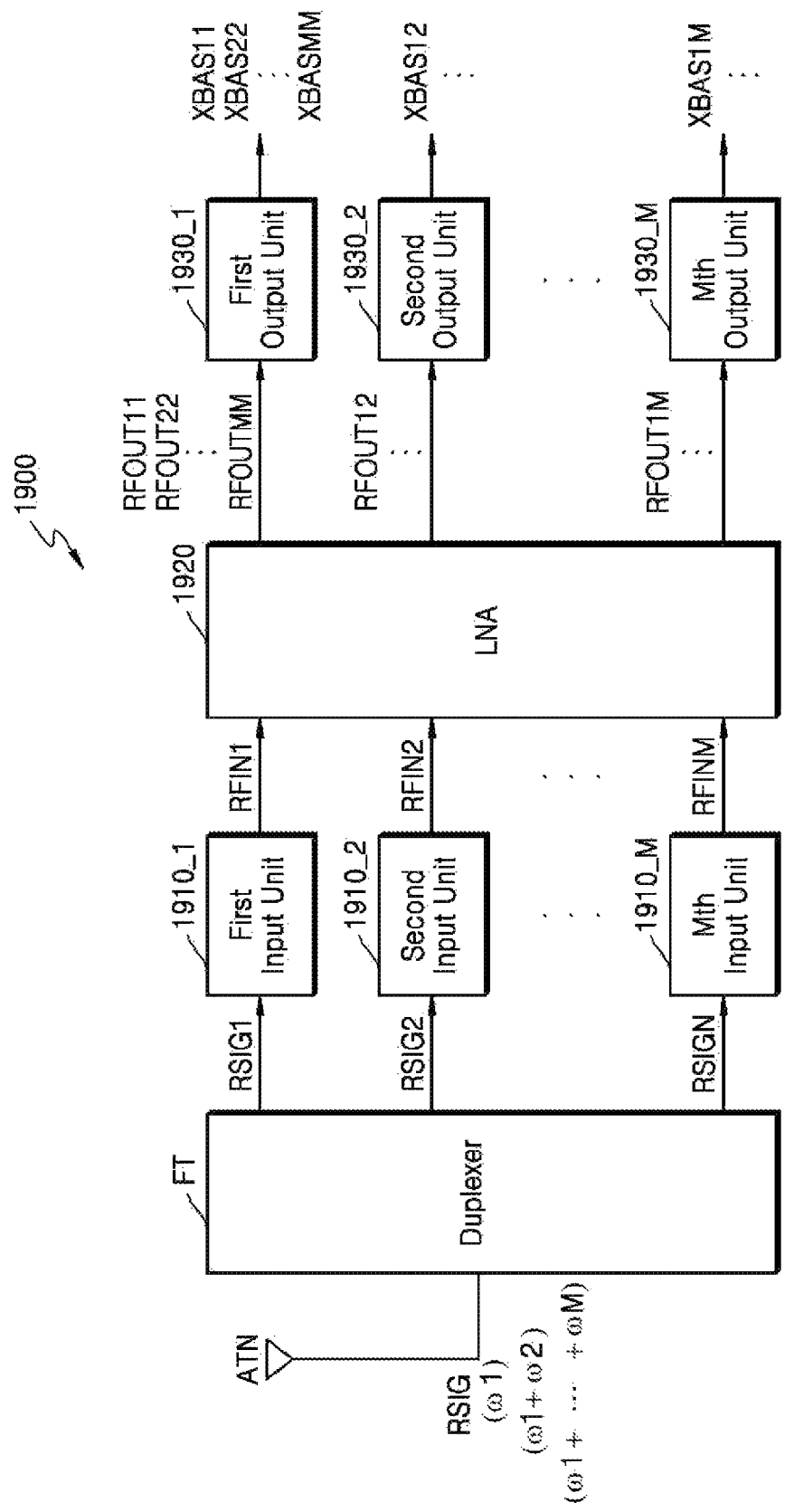
FIG. 19 is a diagram illustrating a wireless terminal, according to an embodiment of the inventive concept.

FIG. 18 is a diagram illustrating a wireless terminal, according to another embodiment of the inventive concept. FIG. 19 is a diagram illustrating a wireless terminal, according to another embodiment of the inventive concept. First, referring to FIG. 18, a wireless terminal 1800 includes a filter FT, a plurality of input units 1810_1 to 1810_N, an LNA 1820, and a plurality of output units 1830_1 to 1830_N, for processing a reception signal RSIG, which is input to the wireless terminal 1800 through an antenna ATN. FIG. 19 illustrates elements for processing the reception signal RSIG among a plurality of elements included in the wireless terminal 1800.

The filter FT filters the reception signal RSIG, input through the antenna ATN, to a signal corresponding to a corresponding frequency band. For example, the filter FT transfers a first reception signal RSIG1, which is a signal of the first frequency band BA among a plurality of reception signals RSIG, to a first input unit 1810_1 and transfers a second reception signal RSIG2, which is a signal of the second frequency band BB, to a second input unit 1810_2. Likewise, the filter FT transfers an Nth reception signal RSIGN, which is a signal of the Nth frequency band among the plurality of reception signals RSIG, to an Nth input unit 1810_N. Here, N is an integer greater than or equal to three. The filter FT may be implemented as a duplexer.

The plurality of input units 1810_1 to 1810_N perform RF matching such as, for example, impedance matching, between the LNA 1820 and a plurality of reception signals RSIG1 to RSIGN applied from the filter FT to transfer signals, obtained through the RF matching, to the LNA 1820. For example, a first input unit 1810_1 processes the first reception signal RSIG1 to transfer a first RF input signal RFIN1 to the LNA 1820, and a second input unit 1810_2 processes a second reception signal RSIG2 to transfer a second RF input signal RFIN2 to the LNA 1820. Likewise, the Nth input unit 1810_N processes the Nth reception signal RSIGN to transfer an Nth RF input signal RFINN to the LNA 1820.

The LNA 1820 respectively amplifies a plurality of RF input signals RFIN1 to RFINN to a plurality of RF output signals RFOUT11 to RFOUT(N-1)2. For example, in the intra-band CA mode, the LNA 1820 amplifies the first RF input signal RFIN1 to a first RF output signal RFOUT11 and a first RF output signal RFOUT12, and amplifies the second RF input signal RFIN2 to a second RF output signal RFOUT21 and a second RF output signal RFOUT22. Likewise, in the intra-band CA mode, the LNA 1820 amplifies the Nth RF input signal RFINN to Nth RF output signals. The LNA 1820 may include a plurality of amplification units. For example, the LNA 1820 may include the first amplification unit 820_1 and second amplification unit 820_2 of FIG. 8 for processing the first RF input signal RFIN1 and the second RF input signal RFIN2. The LNA 1820 may further include another amplification unit that processes another RF input signal (for example, the Nth RF input signal RFINN) and is implemented with the same structure as that of the first amplification unit 820_1 or second amplification unit 820_2 of FIG. 8. In the wireless terminal 1800, according to another embodiment of the inventive concept, since the LNA 1820 includes amplification units that perform the same function as that of the first amplification unit 820_1 or second amplification unit 820_2 of FIG. 8, impedance matching may be performed based on one value in various modes, and thus, operation efficiency is enhanced.

The plurality of output units 1830_1 to 1830_N respectively down-convert the plurality of RF output signals RFOUT11 to RFOUT(N-1)2 transferred from the LNA 1820 to output a plurality of baseband signals XBAS11 to XBAS(N-1)2. For example, in the intra-band CA mode, as described above with reference to FIG. 9C, the first baseband signal XBAS11 corresponding to the first carrier ω1 among the first RF output signals RFOUT11 and RFOUT12 is down-converted by the first output unit 1830_1, and the first baseband signal XBAS12 corresponding to the second carrier ω2 is down-converted by the second output unit 1830_2. Alternatively, in the intra-band CA mode, the second baseband signal XBAS21 corresponding to the first carrier ω1 among the second RF output signals RFOUT21 and RFOUT22 is down-converted by the second output unit 1830_2, and the second baseband signal XBAS22 corresponding to the second carrier ω1 is down-converted by the first output unit 1830_1.

As described above, the first output unit 1830_1 and the second output unit 1830_2 may operate in pairs, however, embodiments of the inventive concept are not limited thereto. For example, the first baseband signal XBAS11 corresponding to the first carrier ω1 among the first RF output signals RFOUT11 and RFOUT12 is down-converted by the first output unit 1830_1, and the first baseband signal XBAS12 corresponding to the second carrier ω2 is down-converted by another output unit instead of the second output unit 1830_2. Likewise, in the intra-band CA mode, the Nth output unit 1830_N may down-convert an Nth RF output signal RFOUTN1 corresponding to the first carrier ω1 or an N-1st RF output signal RFOUT(N-1)2 corresponding to the second carrier ω2.

Referring to FIG. 19, a wireless terminal 1900 includes a filter FT, a plurality of input units 1910_1 to 1910_M, an LNA 1920, and a plurality of output units 1930_1 to 1930_M, for processing a reception signal RSIG that is input to the wireless terminal 1900 through an antenna ATN. However, the wireless terminal 1900 processes a reception signal RSIG into which M number of carriers are aggregated. For example, when the M carriers are included in the first frequency band BA, M number of amplifiers included in the LNA 1920 amplify a first RF input signal RFIN1, obtained through processing by a first input unit 1910_1 relevant to the first frequency band BA, to output M number of first RF output signals RFOUT11 to RFOUT1M. Also, the plurality of output units 1930_1 to 1930_M frequency-down-convert the first RF output signals RFOUT11 to RFOUT1M to output M number of baseband signals XBAS11 to XBAS1M based on a corresponding carrier among M number of carriers. M carriers of another frequency band may be identically processed. An example in which M is three is described in detail below.

Figure 20:
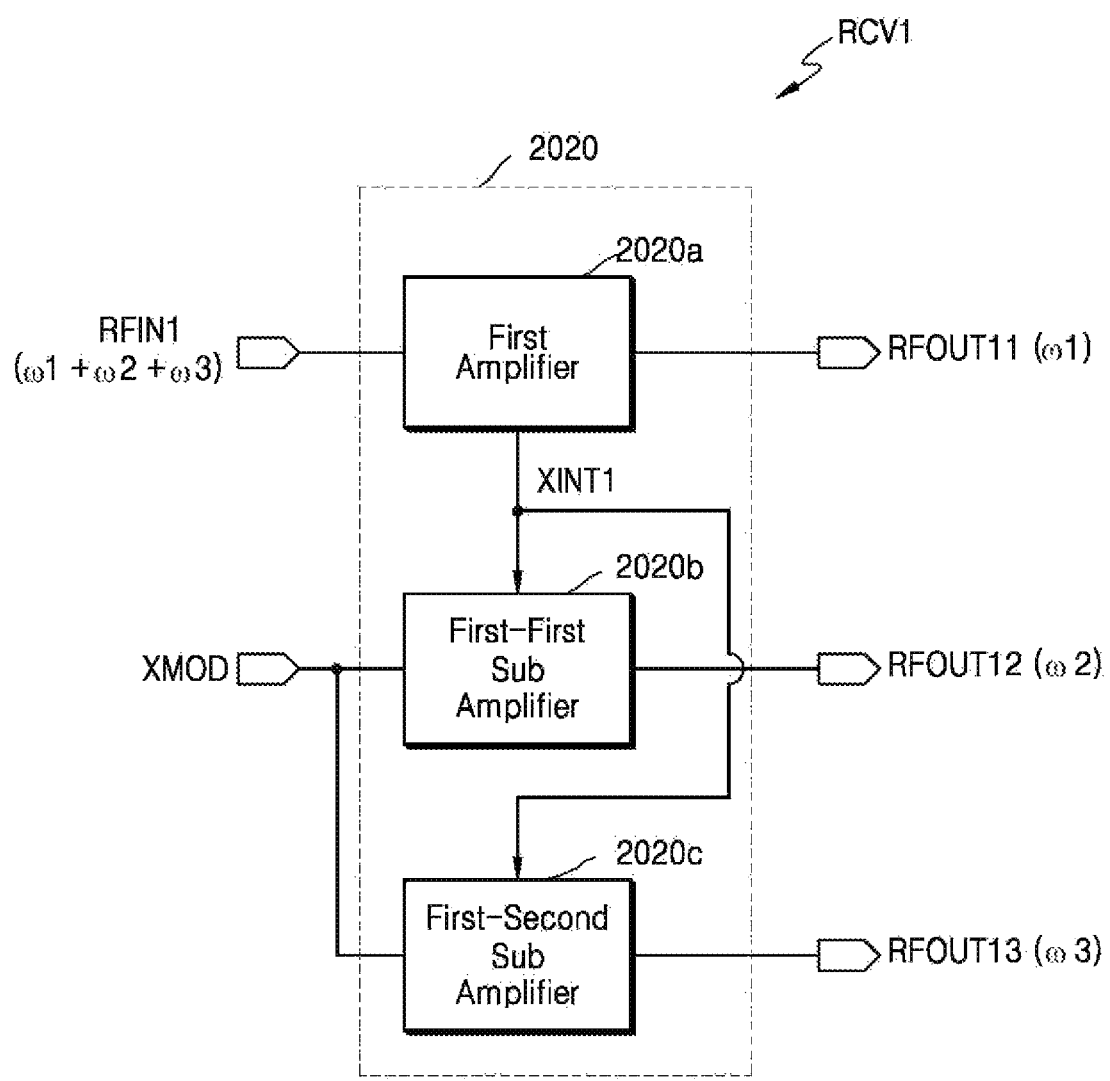
FIG. 20 is a diagram illustrating a first receiver, according to an embodiment of the inventive concept.

FIG. 20 is a diagram illustrating a first receiver, according to another embodiment of the inventive concept. A first receiver RCV1 includes a first amplification unit 2020. The first amplification unit 2020 includes a first amplifier 2020a, a 1-1st sub amplifier 2020b, and a 1-2nd sub amplifier 2020c. In the intra-band CA mode, the first amplifier 2020a receives and amplifies a first RF input signal RFIN1 obtained through modulation based on three or more carriers of the same frequency band to output a first RF output signal RFOUT11 corresponding to a first carrier ω1. In FIG. 20, the first RF input signal RFIN1 is obtained through modulation based on the first carrier ω1, a second carrier ω2, and a third carrier ω3. The 1-1st sub amplifier 2020b amplifies a first internal signal XINT1 applied from the first amplifier 2020a to output a first RF output signal RFOUT12 corresponding to the second carrier ω2. Likewise, the 1-2nd sub amplifier 2020c amplifies the first internal signal XINT1 applied from the first amplifier 2020a to output a first RF output signal RFOUT13 corresponding to the third carrier ω3.

In the intra-band CA mode, in a process where the first receiver RCV1 of FIG. 20 receives and amplifies the first RF input signal RFIN1 obtained through modulation based on three or more carriers of the same frequency band, the 1-1st sub amplifier 2020b amplifies the first internal signal XINT1 from the first amplifier 2020a to generate the first RF output signal RFOUT12 based on the second carrier ω2, and the 1-2nd sub amplifier 2020c amplifies the first internal signal XINT1 to generate the first RF output signal RFOUT13 based on the third carrier ω3. Therefore, input impedances of the first amplification unit 2020 may be the same in the non-CA mode where the 1-1st sub amplifier 2020b and the 1-2nd sub amplifier 2020c are deactivated, the inter-band CA mode where the 1-1st sub amplifier 2020b and the 1-2nd sub amplifier 2020c are deactivated, and the intra-band CA mode where the 1-1st sub amplifier 2020b and the 1-2nd sub amplifier 2020c are activated.

Figure 21:
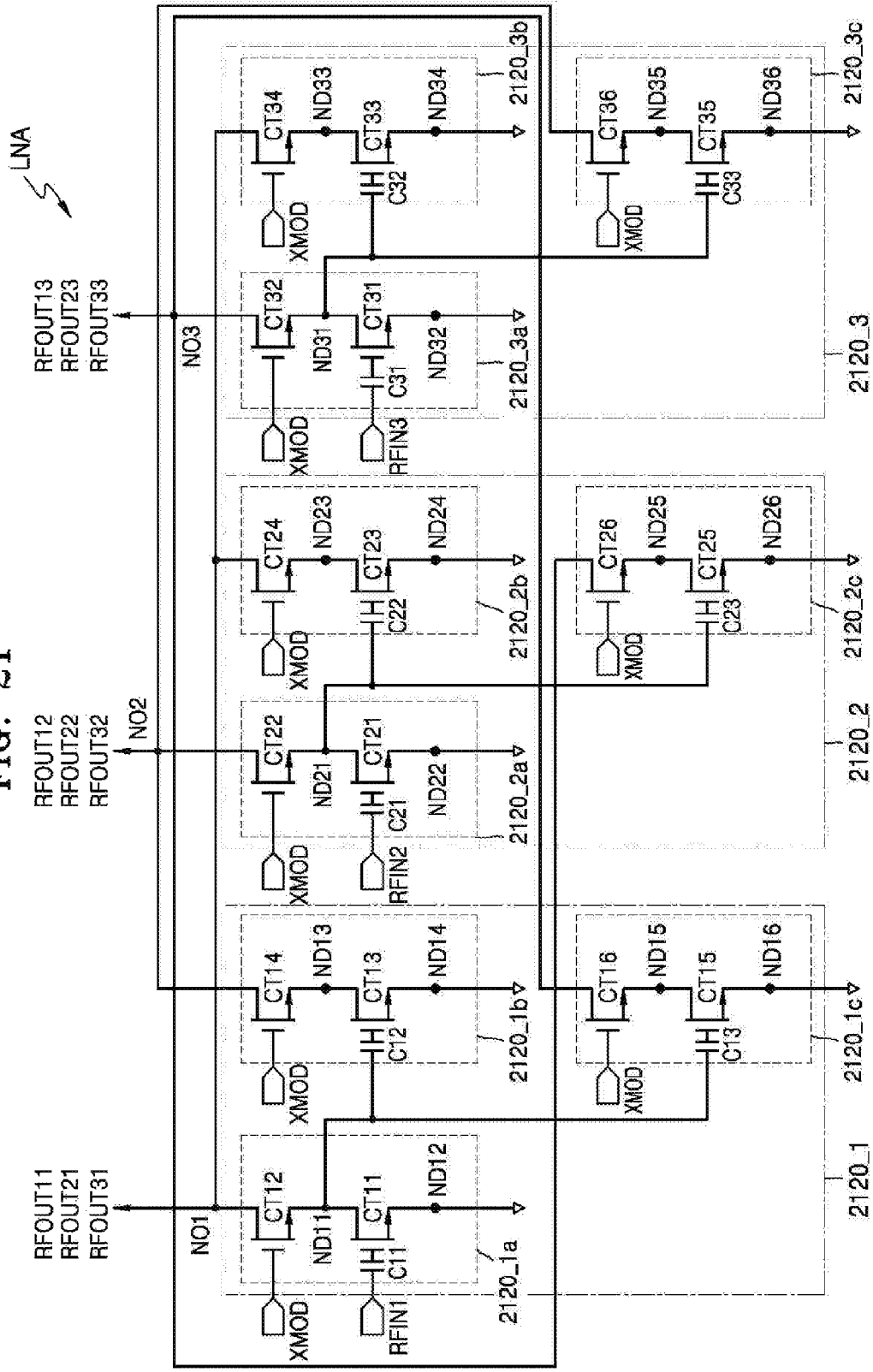
FIG. 21 is a diagram illustrating a low noise amplifier (LNA), according to an embodiment of the inventive concept.

FIG. 21 is a diagram illustrating an LNA, according to an embodiment of the inventive concept. Referring to FIG. 21, the LNA includes a first amplification unit 2120_1 that amplifies a first RF input signal RFIN1, a second amplification unit 2120_2 that amplifies a second RF input signal RFIN2, and a third amplification unit 2120_3 that amplifies a third RF input signal RFIN3. The first RF input signal RFIN1 may be a signal of the first frequency band BA, the second RF input signal RFIN2 may be a signal of the second frequency band BB, and the third RF input signal RFIN3 may be a signal of a third frequency band.

The first amplification unit 2120_1 includes a first amplifier 2120_1a, a 1-1st sub amplifier 2120_1b, and a 1-2nd sub amplifier 2120_1c.

In the non-CA mode and the inter-band CA mode, the first amplifier 2120_1a amplifies the first RF input signal RFIN1 obtained through modulation based on the first carrier ω1 of the first frequency band BA to output a first RF output signal RFOUT11 corresponding to the first carrier ω1 through a first output node NO1. Also, in the intra-band CA mode, the first amplifier 2120_1a amplifies the first RF input signal RFIN1, into which the first carrier ω1, second carrier ω2, and third carrier ω3 of the same frequency band are aggregated, to output the first RF output signal RFOUT11 corresponding to the first carrier ω1 through the first output node NO1. To this end, the first amplifier 2120_1a includes a plurality of transistors CT11 and CT12, which may operate identically to the first and second transistors CT1 and CT2 of FIG. 10. That is, the transistors CT11 and CT12 may operate as a cascode amplifier together, and the transistor CT12 may implemented larger in size than the transistor CT11. Also, when a mode signal XMOD is applied at a high logic level H, the first RF input signal RFIN1 may be applied to a gate of the transistor CT11, and the mode signal XMOD may be applied to a gate of the transistor CT12.

The 1-1st sub amplifier 2120_1b is deactivated in the non-CA mode and the inter-band CA mode, and in the intra-band CA mode, the 1-1st sub amplifier 2120_1b amplifies the first internal signal XINT1, which is a node voltage of a node ND11 of the first amplifier 2120_1a, to output through a second output node NO2 a first RF output signal RFOUT12 corresponding to the second carrier ω2 of the first frequency band BA. To this end, the 1-1st sub amplifier 2120_1b includes a plurality of transistors CT13 and CT14, which operate identically to the third and fourth transistors CT3 and CT4 of FIG. 10. That is, the transistors CT13 and CT14 may operate as a cascode amplifier together. The first internal signal XINT1 is applied to a gate of the transistor CT13, and the mode signal XMOD may be applied to a gate of the transistor CT14.

The 1-2nd sub amplifier 2120_1c is deactivated in the non-CA mode and the inter-band CA mode, and in the intra-band CA mode, the 1-2nd sub amplifier 2120_1c amplifies the first internal signal XINT1, which is the node voltage of the node ND11 of the first amplifier 2120_1a, to output through a third output node NO3 a first RF output signal RFOUT13 corresponding to the third carrier ω3 of the first frequency band BA. To this end, the 1-2nd sub amplifier 2120_1c includes a plurality of transistors CT15 and CT16, which may operate identically to the fifth and sixth transistors CT5 and CT6 of FIG. 10. That is, the transistors CT15 and CT16 may operate as a cascode amplifier together. The first internal signal XINT1 is applied to a gate of the transistor CT15, and the mode signal XMOD is applied to a gate of the transistor CT16. However, one end of the transistor CT16 is connected to the third output node NO3.

The second amplification unit 2120_2 and the third amplification unit 2120_3 are implemented with a structure similar to that of the first amplification unit 2120_1. That is, the second amplification unit 2120_2 includes a second amplifier 2120_2a, a 2-1st sub amplifier 2120_2b, and a 2-2nd sub amplifier 2120_2c, and the third amplification unit 2120_3 includes a third amplifier 2120_3a, a 3-1st sub amplifier 2120_3b, and a 3-2nd sub amplifier 2120_3c. In the non-CA mode and the inter-band CA mode, the 2-1st sub amplifier 2120_2b and the 2-2nd sub amplifier 2120_2c are deactivated, and the 3-1st sub amplifier 2120_3b and the 3-2nd sub amplifier 2120_3c are deactivated.

In each of the non-CA mode, the inter-band CA mode, and the intra-band CA mode, the second amplifier 2120_2a outputs a second RF output signal RFOUT22 corresponding to the second carrier ω2 of the second frequency band BB through the second output node NO2. The second amplifier 2120_2a includes a plurality of transistors CT21 and CT22. In the intra-band CA mode, each of the 2-1st sub amplifier 2120_2b and the 2-2nd sub amplifier 2120_2c amplifies a second internal signal XINT2 which is a node voltage of a node ND21 of the second amplifier 2120_2a. The 2-1st sub amplifier 2120_2b outputs, through the first output node NO1, the amplified second internal signal XINT2 as a second RF output signal RFOUT21 corresponding to the first carrier ω1 included in the second frequency band BB. The 2-2nd sub amplifier 2120_2c outputs, through a third output node NO3, the amplified second internal signal XINT2 as a second RF output signal RFOUT23 corresponding to the third carrier ω3 included in the second frequency band BB.

In each of the non-CA mode, the inter-band CA mode, and the intra-band CA mode, the third amplifier 2120_3a outputs a third RF output signal RFOUT33 corresponding to the third carrier ω3 of the third frequency band through the third output node NO3. The third amplifier 2120_3a includes a plurality of transistors CT31 and CT32. In the intra-band CA mode, each of the 3-1st sub amplifier 2120_3b and the 3-2nd sub amplifier 2120_3c amplifies a third internal signal XINT3, which is a node voltage of a node ND31 of the third amplifier 2120_3a. The 3-1st sub amplifier 2120_3b outputs, through the first output node NO1, the amplified third internal signal XINT3 as a third RF output signal RFOUT31 corresponding to the first carrier ω1 included in the third frequency band. The 3-2nd sub amplifier 2120_3c outputs, through a second output node NO2, the amplified third internal signal XINT3 as a third RF output signal RFOUT32 corresponding to the second carrier ω2 included in the third frequency.

A plurality of capacitors for gate biasing are respectively connected to gates of the transistors CT11, CT13, CT15, CT21, CT23, CT25, CT31, CT33, and CT35 of FIG. 21. Although not shown in FIG. 21, as in FIG. 10, the mode signal XMOD is applied to the gates of the transistors CT11, CT13, CT15, CT21, CT23, CT25, CT31, CT33, and CT35 of FIG. 21.

As described above, in the receiver, the wireless terminal, and the operation method of the wireless terminal according to the exemplary embodiments, when multi carriers are included in different frequency bands, amplifiers that receive an RF input signal, which includes each of the carriers, output an RF output signal. When the multi carriers are included in the same frequency band, an RF output signal based on one carrier is output through an amplifier that receives an RF input signal including a corresponding carrier, and an RF output signal based on another carrier is output through a sub amplifier that processes a signal applied from an amplifier. Input impedances of the receiver are the same irrespective of whether the multi carriers are included in different frequency bands or are included in the same frequency band. Therefore, loss is prevented from occurring when impedance matching is changed according to operation modes. Also, accordingly, a noise feature or a gain feature is not degraded, and thus, power consumption of the receiver or the wireless terminal including the receiver is reduced, thereby accurately processing a received signal. In the receiver, the wireless terminal, and the operation method of the wireless terminal, according to embodiments of the inventive concept, one amplifier amplifies a signal according to a voltage gain thereof and transfers the amplified signal to another amplifier. Thus, an RF carrier signal obtained through modulation based on multi carriers of the same frequency band is amplified, thereby decreasing power consumption and maintaining a noise feature and a gain feature. Accordingly, a signal receiving sensitivity of the wireless terminal is enhanced, and the reliability of the wireless terminal is enhanced. Therefore, in the receiver, the wireless terminal, and the operation method of the wireless terminal, according to embodiments of the inventive concept, a received signal is efficiently processed.

Figure 22:
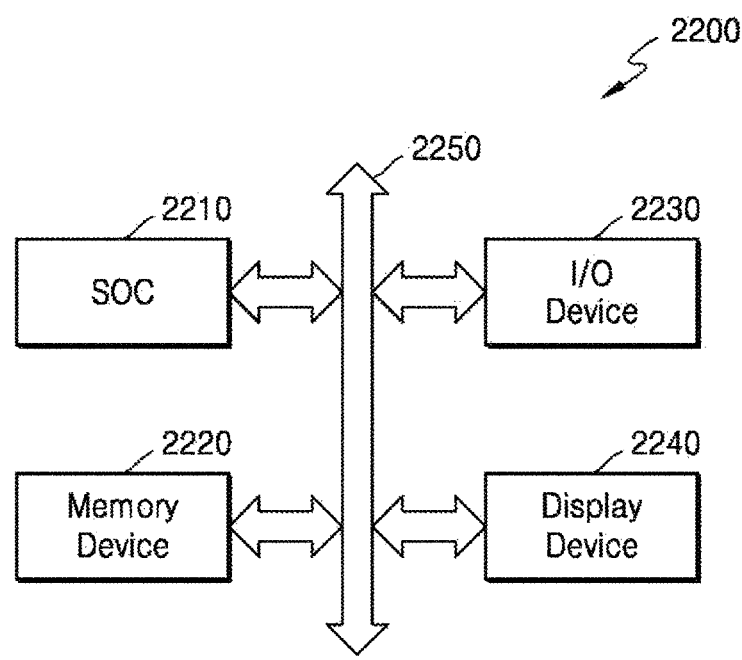
FIG. 22 is a diagram illustrating a computing system, according to an embodiment of the inventive concept.

FIG. 22 is a diagram illustrating a computing system, according to an embodiment of the inventive concept. Referring to FIG. 22, a computing system 2200 such as, for example, a mobile device, a desktop computer, a server, or the like includes a system-on chip (SOC) 2210, a memory device 2220, an input/output (I/O) device 2230, and a display device 2240. Such elements are electrically connected to a bus 2250. The input/output device 2230 of FIG. 22 include the first receiver RCV1 of FIG. 1.

Figure 23:
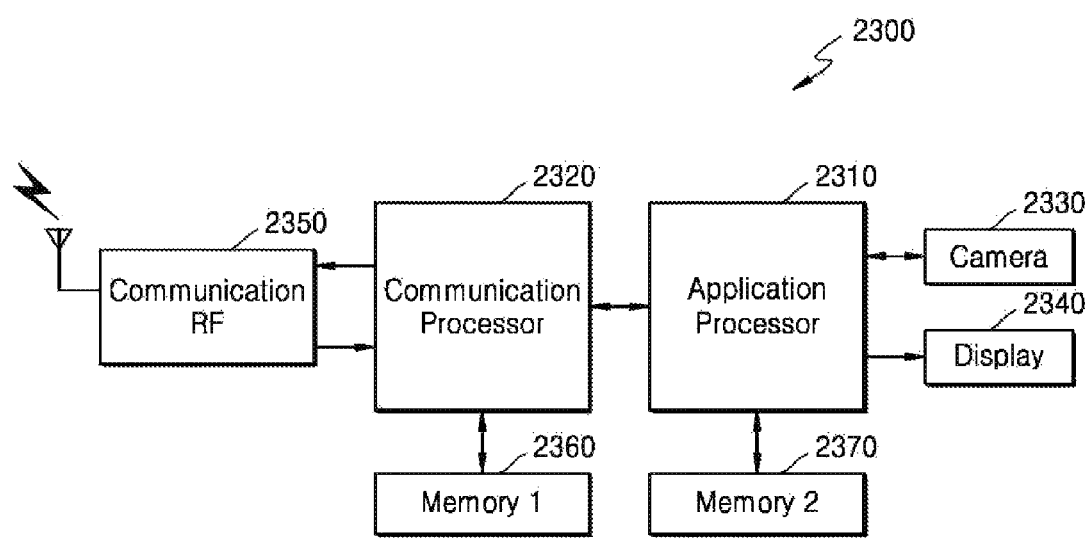
FIG. 23 is a diagram illustrating a wireless terminal, according to an embodiment of the inventive concept.

FIG. 23 is a diagram illustrating a wireless terminal, according to an embodiment of the inventive concept. Referring to FIG. 23, a wireless terminal 2300 includes an application processor 2310 implemented as an SOC, a communication processor 2320, a camera 2330, a display 2340, a communication RF 2350, and a plurality of memories 2360 and 2370. In the wireless terminal 2300, an application may be executed by the application processor 2310. For example, when the camera 2330 captures an image, the application processor 2310 may store the captured image in a second memory 2370 and may display the captured image on the display 2340. The captured image may be transmitted externally through the communication RF 2350 as controlled by the communication processor 2320. In this case, the communication processor 2320 may temporarily store the image in a first memory 2360, for transmitting the image. In addition, the communication processor 2320 may control call, communication for transmitting or receiving data, and/or the like. The communication RF 2350 may include the first receiver RCV1 of FIG. 1.

The present embodiments may be utilized in conjunction with the manufacture of integrated circuits, systems on chips, or chip sets. In general, a plurality of identical die are typically formed in a repeated pattern on a surface of a semiconductor wafer. Each die may include other structures or circuits. The individual die are cut or diced from the wafer, then packaged as an integrated circuit. One skilled in the art would know how to dice wafers and package die to produce integrated circuits. Integrated circuits so manufactured are considered part of this disclosure.

As described above, in the receiver, the wireless terminal, and the operation method of the wireless terminal, according to embodiments of the inventive concept, when multi carriers are included in different frequency bands, amplifiers that receive an RF input signal including each of the carriers output an RF output signal. When the multi carriers are included in the same frequency band, an RF output signal based on one carrier are output through an amplifier that receives an RF input signal including a corresponding carrier, and an RF output signal based on another carrier are output through a sub amplifier that processes a signal applied from an amplifier, whereby input impedances of the receiver are the same irrespective of whether the multi carriers are included in different frequency bands or are included in the same frequency band. Therefore, loss is prevented from occurring when impedance matching is changed according to operation modes. Also, accordingly, a noise feature or a gain feature is not degraded, and thus, power consumption of the receiver or the wireless terminal including the receiver is reduced, thereby accurately processing a received signal.

In the receiver, the wireless terminal, and the operation method of the wireless terminal, according to embodiments of the inventive concept, one amplifier amplifies a signal according to a voltage gain thereof and transfers the amplified signal to another amplifier. Thus, an RF carrier signal obtained through modulation based on multi carriers of the same frequency band is amplified, thereby decreasing power consumption and maintaining a noise feature and a gain feature. Accordingly, a signal receiving sensitivity of the wireless terminal is enhanced, and the reliability of the wireless terminal is enhanced.

Therefore, in the receiver, the wireless terminal, and the operation method of the wireless terminal, according to embodiments of the inventive concept, a received signal is efficiently processed.

An LTE-A mobile network has been described above; however, embodiments of the inventive concept are not limited thereto. In other embodiments of the inventive concept, the receiver and the wireless terminal may operate on various mobile networks such as, for example, code division multiple access (CDMA), global system for mobile communication (GSM), a wireless local area network (WLAN), or the like.

While the inventive concept has been shown and described with reference to embodiments thereof, it will be understood by those skilled in the art that various changes in form and detail may be made therein without departing from the spirit and scope of the inventive concept as defined by the appended claims.

What is claimed is:

1. A receiver comprising:
  a first amplifier configured to receive and amplify a first radio frequency (RF) input signal, and configured to output a first RF output signal corresponding to a first carrier included in a first frequency band; and
  a first sub amplifier configured to, when a mode signal indicates a first mode, receive a first internal signal from the first amplifier, amplify the first internal signal, and output a second RF output signal corresponding to a second carrier included in the first frequency band.

2. The receiver of claim 1, wherein the first mode is an intra-band carrier aggregation (CA) mode where the first carrier and the second carrier are aggregated into the first RF input signal.

3. The receiver of claim 1, wherein the first amplifier is configured to amplify the first RF input signal according to a first gain to provide the first internal signal to the first sub amplifier.

4. The receiver of claim 1, wherein
  the first amplifier and the first sub amplifier are included in a first amplification unit, and
  an input impedance of the first amplification unit is the same in the first mode and a second mode, the second mode being different from the first mode.

5. The receiver of claim 1, wherein
  the first amplifier comprises:
    a first transistor connected between a first node and a second node, the first RF input signal being applied to a first gate of the first transistor; and
    a second transistor including a first source connected to the first node and a first drain of the first transistor, a second drain connected to a first output node, and a second gate receiving the mode signal, the second transistor being smaller in size than the first transistor; and
  the first sub amplifier comprises:
    a third transistor connected between a third node and a fourth node, a third gate of the third transistor receiving the first internal signal from the first node; and
    a fourth transistor including a second source connected to the third node and a third drain of the third transistor, a fourth drain connected to a second output node, and a fourth gate receiving the mode signal.

6. The receiver of claim 5, wherein:
  the first amplifier further comprises a source degeneration inductor connected between the second node and a ground terminal; and
  the first sub amplifier further comprises a serial feedback resistor connected between the fourth node and the ground terminal.

7. The receiver of claim 5, wherein the first amplifier and the first sub amplifier operate as a cascode amplifiers.

8. The receiver of claim 1, further comprising:
  a first output circuit configured to down-convert the first RF output signal to a baseband corresponding to the first carrier, and configured to output a first output signal obtained through the down-conversion; and
  a second output circuit configured to down-convert the second RF output signal to a baseband corresponding to the second carrier, and configured to output a second output signal obtained through the down-conversion.

9. The receiver of claim 1, further comprising:
  a second amplifier configured to receive and amplify a second RF input signal, and configured to output a third RF output signal corresponding to a third carrier included in a second frequency band; and
  a second sub amplifier configured to, when the mode signal indicates the first mode, receive a second internal signal from the second amplifier, amplify the second internal signal, and output a fourth RF output signal corresponding to a fourth carrier included in the second frequency band.

10. The receiver of claim 9, further comprising:
a first output unit configured to down-convert the first RF output signal or the fourth RF output signal to a baseband, and configured to output a first signal obtained through the down-conversion; and
a second output unit configured to down-convert the third RF output signal or the second RF output signal to a baseband, and configured to output a second signal obtained through the down-conversion.

11. A wireless terminal comprising:
a first receiver, the first receiver comprising:
   a first input unit configured to perform impedance matching on a first reception signal to output a first radio frequency (RF) input signal, the first reception signal being obtained by filtering a received signal based on a first frequency band;
   a first amplification unit configured to amplify the first RF input signal received from the first input unit and output a first RF output signal corresponding to a first carrier included in a first frequency band, and configured to amplify a first internal signal generated from the first RF input signal and output a second RF output signal corresponding to a second carrier included in the first frequency band when in an intra-band carrier aggregation (CA) mode; and
   a first output unit configured to down-convert at least one of the first and second RF output signals to a baseband.

12. The wireless terminal of claim 11, further comprising:
a second receiver, the second receiver comprising:
   a second input unit configured to perform impedance matching on a second reception signal to output a second RF input signal, the second reception signal being obtained by filtering the reception signal based on a second frequency band;
   a second amplification unit configured to amplify the second RF input signal received from the second input unit to output one or more second RF output signals in the inter-band CA mode and the intra-band CA mode; and
   a second output unit configured to down-convert at least one of the one or more second RF output signals to the baseband.

13. The wireless terminal of claim 12, wherein, in an inter-band CA mode:
the first amplification unit outputs a single first RF output signal; and
the second amplification unit outputs a single second RF output signal.

14. The wireless terminal of claim 12, wherein, in the intra-band CA mode,
the first internal signal is obtained by amplifying the first RF input signal according to a first gain.

15. The wireless terminal of claim 14, wherein:
the first amplification unit comprises a first amplifier and a first sub amplifier, the first sub amplifier being activated in the intra-band CA mode;
the first amplifier comprises:
   a first transistor connected between a first node and a second node, the first transistor including a first gate receiving the first RF input signal; and
   a second transistor configured to output, to a first output node, the first RF output signal, the second transistor including a first source connected to the first node and a first drain of the first transistor; and the first sub amplifier comprises:
   a third transistor connected between a third node and a fourth node, the third transistor including a second gate receiving the first internal signal from the first node; and
   a fourth transistor configured to output the second RF output signal, the fourth transistor including a second source connected to the third node and a second drain of the third transistor, and a third drain connected to a second output node.

16. The wireless terminal of claim 15, wherein
the first RF output signal has a same level as that of the second RF output signal, and
a direct current (DC) current consumed when the first sub amplifier outputs the second RF output signal is smaller than a DC current consumed when the first amplifier outputs the first RF output signal corresponding to the first carrier.

17. The wireless terminal of claim 15, wherein:
the first RF output signal is down-converted by the first output unit, and
the second RF output signal is down-converted by the second output unit.

18. The wireless terminal of claim 12, wherein, in the intra-band CA mode:
the first amplification unit outputs a third RF output signal corresponding to a third carrier of the first frequency band based on the received first internal signal.

19. The wireless terminal of claim 12, wherein, in the intra-band CA mode:
the one or more second RF output signals comprises two second RF output signals and
the second amplification unit outputs one of the two second RF output signals corresponding to the first carrier, and outputs a second internal signal, obtained by amplifying the second RF input signal according to a first gain, as another of the two second RF output signals corresponding to the second carrier.

20. A wireless terminal comprising:
an antenna configured to receive a reception signal transmitted over a long-term evolution advanced (LTE-A) communication network;
a filter configured to filter the reception signal based on a plurality of frequency bands; and
a plurality of receivers configured to process a filtered signal to generate a baseband signal,
wherein at least one of the plurality of receivers comprises:
   a first amplifier comprising a first transistor connected between a first node and a second node, the first transistor including a first gate that receives an RF input signal obtained by performing impedance matching on the filtered signal, and a second transistor configured to output a first RF output signal corresponding to a first carrier, the second transistor being larger in size than the first transistor, the second transistor including a first source connected to the first node and a first drain of the first transistor, and the second transistor including a second drain connected to a first output node; and
   a first sub amplifier comprising a third transistor connected between a third node and a fourth node, the third transistor being activated in an intra-band carrier aggregation (CA) mode, and the third transistor including a second gate that receives a first internal signal from the first node, the first sub amplifier further comprising a fourth transistor configured to output a second RF output signal corresponding to a second carrier of a frequency band of the first carrier, the fourth transistor including a second source connected to the third node and a third drain of the third transistor, and the fourth transistor including a fourth drain connected to a second output node.

* * * * *